US008097815B2

(12) United States Patent
Watanabe

(10) Patent No.: US 8,097,815 B2
(45) Date of Patent: Jan. 17, 2012

(54) PRINTED CIRCUIT BOARD AND ITS DESIGNING METHOD, AND DESIGNING METHOD OF IC PACKAGE TERMINAL AND ITS CONNECTING METHOD

(75) Inventor: Masaki Watanabe, Shiga (JP)

(73) Assignee: Panasonic Corporation, Osaka (JP)

( * ) Notice: Subject to any disclaimer, the term of this patent is extended or adjusted under 35 U.S.C. 154(b) by 769 days.

(21) Appl. No.: 11/665,561

(22) PCT Filed: Dec. 2, 2005

(86) PCT No.: PCT/JP2005/022157

§ 371 (c)(1), (2), (4) Date: Apr. 17, 2007

(87) PCT Pub. No.: WO2006/059706

PCT Pub. Date: Jun. 8, 2006

(65) Prior Publication Data

US 2008/0277152 A1 Nov. 13, 2008

(30) Foreign Application Priority Data

Dec. 2, 2004 (JP) ................................ 2004-349355

(51) Int. Cl.
*H05K 1/11* (2006.01)

(52) U.S. Cl. ........ 174/266; 174/262; 174/263; 174/264; 361/767; 361/777; 361/768

(58) Field of Classification Search .................. 361/793, 361/794, 795; 174/263, 262, 266, 264
See application file for complete search history.

(56) References Cited

U.S. PATENT DOCUMENTS

| | | | | |
|---|---|---|---|---|
| 5,450,290 | A * | 9/1995 | Boyko et al. | 361/792 |
| 5,477,082 | A * | 12/1995 | Buckley et al. | 257/679 |
| 5,557,502 | A | 9/1996 | Banerjee et al. | |
| 5,875,102 | A * | 2/1999 | Barrow | 361/777 |
| 6,386,435 | B1 | 5/2002 | Downes | |
| 6,707,683 | B1 * | 3/2004 | Bravek et al. | 361/777 |

(Continued)

FOREIGN PATENT DOCUMENTS

CN 1449029 A 10/2003

(Continued)

OTHER PUBLICATIONS

European Search Report, issued in Corresponding European Patent Application No. 05811438.0-2214, date on Oct. 8, 2007.

(Continued)

*Primary Examiner* — Tuan T Dinh
*Assistant Examiner* — Steven Sawyer
(74) *Attorney, Agent, or Firm* — McDermott Will & Emery LLP

(57) ABSTRACT

The invention provides a printed circuit board capable of mounting BGA or other IC package of narrow terminal interval by using through-holes of conventional size. On one principal surface of printed circuit board (1), soldering lands (2*a*), (2*b*), (2*c*), and (2*d*) for connecting solder balls are disposed in lattice. Central point (B) of through-hole (3) is set eccentric to the side of soldering land (2*a*) at the same potential as through-hole (3), remote from intersection (A) formed by diagonal line (200*ab*) linking soldering lands (2*a*) and (2*b*) and diagonal line (200*cd*) linking soldering lands (2*c*) and (2*d*).

20 Claims, 21 Drawing Sheets

U.S. PATENT DOCUMENTS

| | | | | |
|---|---|---|---|---|
| 2002/0084312 | A1 * | 7/2002 | Shier et al. | 228/180.22 |
| 2002/0108777 | A1 * | 8/2002 | Joy et al. | 174/260 |
| 2003/0047348 | A1 | 3/2003 | Jessep et al. | |
| 2003/0184986 | A1 | 10/2003 | Soga et al. | |

FOREIGN PATENT DOCUMENTS

| | | | |
|---|---|---|---|
| EP | 0 517 399 | A1 | 12/1992 |
| GB | 2 176 942 | A | 1/1987 |
| JP | 7-235761 | | 9/1995 |
| JP | 07-235761 | A | 9/1995 |
| JP | 8-288658 | | 11/1996 |
| JP | 08-288658 | A | 11/1996 |
| JP | 2000-349191 | | 12/2000 |
| JP | 2000-349191 | A | 12/2000 |
| JP | 2001-168511 | | 6/2001 |
| JP | 2001-168511 | A | 6/2001 |
| JP | 2003-23243 | | 1/2003 |
| JP | 2003-298220 | | 10/2003 |
| JP | 2004-281471 | | 10/2004 |

OTHER PUBLICATIONS

European Office Action issued in European Patent Application No. EP 05 811 438.0/2214 dated on Mar. 12, 2009.

Chinese Office Action issued in Chinese Patent Application No. CN 200580040664X dated Feb. 20, 2009.

* cited by examiner

200ab
5
2b
5
2d
42
L42
L40
5
A
L42
B
L40
3
4
200cd
2c
2a
1

PRINTED CIRCUIT BOARD AND ITS DESIGNING METHOD, AND DESIGNING METHOD OF IC PACKAGE TERMINAL AND ITS CONNECTING METHOD

RELATED APPLICATIONS

This application is the U.S. National Phase under 35 U.S.C. §371 of International Application No. PCT/JP2005/022157, filed on Dec. 2, 2005, which in turn claims the benefit of Japanese Application No. 2004-349355, filed on Dec. 2, 2004, the disclosures of which Applications are incorporated by reference herein.

TECHNICAL FIELD

The present invention relates to a printed circuit board mounting IC (integrated circuit) or LSI (large scale integrated circuit) packaged in BGA (ball grid array) and its designing method, and designing method of IC package terminal and its connecting method

BACKGROUND ART

The BGA is a surface mounting package developed for mounting a multipin circuit such as LSI on printed circuit board. In the BGA, solder material is formed into small balls, which are disposed at specific intervals in lattice on principal surface or other surface of IC package. They are soldered and mounted on the surface of soldering land provided on the printed circuit board.

FIG. 15 shows an example of printed circuit board for mounting the BGA. On a principal surface of the printed circuit board 100, plural soldering lands 101, 101*a* are provided, and wiring patterns 102 are connected to the soldering lands 101.

It is relatively easy to draw out a wiring pattern 102 from a soldering land 101 provided near the outer circumference of a printed circuit board 100 toward the outside of the printed circuit board 100. It is, however, difficult to draw out the wiring pattern connected to the soldering land 101*a* existing inside of the printed circuit board 100 toward the outside of the printed circuit board 100.

In the soldering land 101*a* which is hard to draw out the wiring from principal surface (or other principal surface) of printed circuit board 100, the wiring must be drawn out from other principal surface 100*b* (see FIG. 16) of printed circuit board 100 by opening a through-hole penetrating from one principal surface to other principal surface of printed circuit board 100.

FIG. 16 is a sectional view of connection parts when soldering the printed circuit board 100 having through-holes and BGA 103.

In FIG. 16, a plurality of terminals 104 are provided on principal surface 103*a* of BGA 103, and solder balls 105 are connected to terminals 104. No element is formed on other principal surface 103*b* of BGA 103. On principal surface 100*a* of printed circuit board 100, soldering lands 101 are provided corresponding to terminals 104 of principal surface 103*a* of BGA 103. Solder balls 105 are connected to soldering lands 101. Soldering lands 101 are drawn out to outside by way of wiring pattern 102. Conductors 109 are provided in the inner wall of through-hole upper lands 107 and through-holes 106, and are drawn out to the side of other principal surface 100*b* of printed circuit board 100 by way of through-hole lower lands 108.

Thus, when drawing out the wiring pattern 102 to the side of other principal surface 100*b* of printed circuit board 100, it is general to open through-holes 1006 penetrating through the printed circuit board 100. If pitch A becomes narrow between terminal 104 and adjacent terminal 104 of BGA 103, sufficient insulation distance (interval) cannot be provided between the through-hole upper lands 107 and soldering lands 101 (between B and C in FIG. 16), electric insulation reliability is lowered.

FIG. 17A shows a case of setting pitch P104*a* of terminals 104 of BGA 103 at 1.0 mm. At this time, diameter ϕ110 of soldering lands 110 is 0.5 mm, and diameter ϕ106 of through-holes 106 is 0.3 mm. Diameter ϕ107 of through-hole upper lands 107 is 0.6 mm.

In the configuration in FIG. 17A, interval L17*a* of soldering land 110 and through-hole upper land 107 is 157 μm. This interval is sufficient in relation to the necessary insulation distance of 100 μm for preventing electric short-circuit accident between through-hole upper lands 107 and soldering lands 110, and a sufficient electric insulation is assured.

FIG. 17B shows a case of setting pitch P104*b* of terminals 104 of BGA 103 at 0.8 mm. At this time, diameter ϕ110 of soldering lands 110 is 0.4 mm, and diameter ϕ106 of through-holes 106 is 0.3 mm. Diameter ϕ107 of through-hole upper lands 107 is 0.6 mm.

In the configuration in FIG. 17B, interval L17*b* of soldering land 111 and through-hole upper land 107 is 66 μm. This interval is not satisfactory in relation to the necessary insulation distance of 100 μm for preventing electric short-circuit accident between through-hole upper lands 107 and soldering lands 110. Therefore, unlike FIG. 17A, it is not sufficient to satisfy electric insulation.

Degree of pitch of BGA (pitch A in FIG. 16) varies with the increasing functions of digital appliances such as cellphones and portable digital music players, and downsizing tendency. Narrow pitches are preferred recently, and a terminal width of less than 0.5 mm is known. It is estimated to be difficult to develop inexpensive printed circuit boards applicable to such narrow pitches.

Various methods have been proposed to assure sufficient electric insulation and prevent electrical short-circuit between through-hole upper lands 107 and soldering lands 101 placed at positions of different potential.

For example, it is proposed to decrease the diameter ϕ106 of through-holes 106 and diameter ϕ107 of through-hole upper lands 107. This is shown in FIG. 18. In FIG. 18, diameter ϕ112 of soldering lands 112 is 0.4 mm, diameter ϕ106 of through-holes 106 is 0.25 mm, and diameter ϕ107 of through-hole upper lands 107 is 0.5 mm. If the through-holes 106 are in this size, a sufficient distance can be assured between the through-hole upper lands 107 and soldering lands 112.

However, to narrow diameter ϕ106 of through-holes 106, a fine drill must be used when forming through-holes in printed circuit board 100. Accordingly, the thickness of printed circuit board must be reduced to a specified thickness. This method is hence difficult if the thickness of printed circuit board cannot be reduced as desired.

Diameter ϕ107 of through-hole upper lands 107 can be reduced without changing diameter ϕ106 of through-holes 106. In this case, through-holes 106 must be disposed at specified positions at high precision, and the manufacturing yield and processing yield of printed circuit board are lowered, and the cost of printed circuit board is increased.

To assure insulation distance between soldering lands of different potentials within a specified interval, it may be considered to minimize diameter ϕ112 of soldering lands 112. However, if diameter ϕ112 of soldering lands 112 is reduced, cracks are likely to be formed, and mechanical and electrical connection reliability is lowered.

Moreover, to assure insulation distance between soldering lands of different potentials within a specified interval, a method called pad-on-via is known. As shown in FIG. 19 and FIG. 20, vacant portion of through-hole 106 is filled up, and soldering land 113 is provided on through-hole 106. As a result, the through-hole 106 and soldering land 113 are disposed at the same position, and insulation distance from other soldering lands can be assured.

However, IVH (interstitial via hole) substrate or build-up substrate shown in FIG. 19 or FIG. 20 is expensive, and the substrate 100 filling up the through-holes 106 is also expensive as compared with general substrate having through-holes of penetrate-through type. In FIG. 19 and FIG. 20, through-holes 106 and soldering lands 113 are also shown.

In addition, to assure insulation distance between soldering lands of different potentials within a specified interval, another method is known as shown in FIG. 21, in which through-hole upper lands 107 are used as soldering lands (see, for example, Japanese Patent Application Laid-Open No. 2001-168511).

In this method, however, the amount of solder loaded into each through-hole 106 is not constant. As a result, the amount of solder for connecting the terminals 104 and through-hole upper lands 107 varies, and satisfactory reliability cannot be maintained in mechanical and electrical connection. In FIG. 21, BGA 103 and solder balls 105 are also shown.

DISCLOSURE OF THE INVENTION

It is hence a primary object of the invention to present a printed circuit board capable of mounting BGA and other IC package of narrow terminal interval on printed circuit board by using through-holes of conventional size.

The printed circuit board of the invention is a printed circuit board for mounting an IC package having plural connection terminals arrayed in lattice. It comprises plural soldering lands for connecting connection terminals of package, and through-holes penetrating through the printed circuit board from one principal surface to other principal surface. Conductors are formed in through-holes. Of the through-holes, the circumference of the same side as soldering lands has through-hole upper lands. Through-holes surrounded by plural soldering lands are set eccentric to the soldering land side at same potential as connection with through-hole upper lands.

The printed circuit board of the invention is a printed circuit board for mounting an IC package having plural connection terminals arrayed in lattice. It comprises plural soldering lands for connecting connection terminals of package, and through-holes penetrating through the printed circuit board from one principal surface to other principal surface. Conductors are formed in through-holes. Of the through-holes, the circumference of the same side as soldering lands has through-hole upper lands. The printed circuit board is formed in a concave shape in through-hole upper parts surrounded by plural soldering lands. Through-hole upper lands are formed in the concave bottom of printed circuit board.

The printed circuit board of the invention is a printed circuit board for mounting an IC package having plural connection terminals arrayed in lattice. It comprises plural soldering lands for connecting connection terminals of package, and through-holes for guiding conductors by penetrating through the printed circuit board from one principal surface to other principal surface. Of the through-holes, the circumference of the same side as soldering lands has through-hole upper lands. Ribs of insulating material are provided on the printed circuit board between through-hole upper parts surrounded by plural soldering lands, and soldering lands of different potential not connected to the through-hole upper lands.

The printed circuit board of the invention is a printed circuit board for mounting an IC package having plural connection terminals arrayed in lattice. It comprises plural soldering lands for connecting connection terminals of package, and through-holes penetrating through the printed circuit board from one principal surface to other principal surface. Conductors are formed in through-holes. Of the through-holes, the circumference of the same side as soldering lands has through-hole upper lands. Grooves are provided on the printed circuit board between through-hole upper parts surrounded by plural soldering lands, and soldering lands of different potential not connected to the through-hole upper lands.

By these configurations, without using through-holes of particularly small size, an IC package such as BGA of narrow terminal interval or narrow pitch type can be mounted on a printed circuit board. Therefore, the printed circuit board is lowered in cost.

Designing method of printed circuit board of the invention is characterized by disposing through-holes on the printed circuit board.

Designing method of connection terminals of IC package of the invention is characterized by disposing plural connection terminals of same potential at close distance.

Connection method of IC package of the invention is characterized by disposing plural connection terminals of same potential at close distance in the array of connection terminals of IC package.

According to the printed circuit board and designing method of printed circuit board of the invention, and designing method of terminals of IC package and connection method thereof, through-holes of conventional size can be used, and IC package such as BGA of narrow terminal interval can be mounted in spite of an inexpensive printed circuit board.

REFERENCE NUMERALS IN THE DRAWINGS

Figure 1:
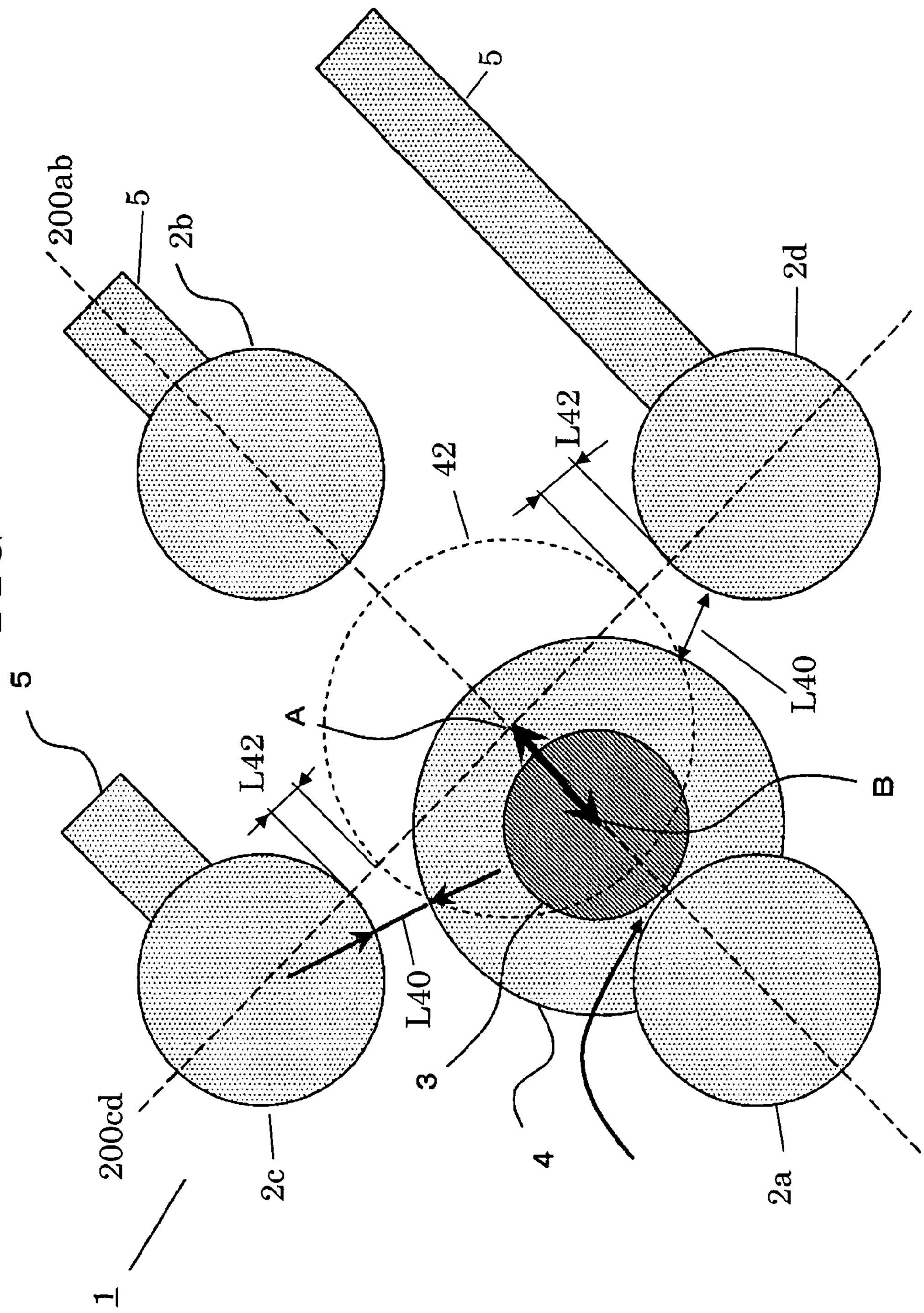
FIG. 1 is a diagram of printed circuit board in preferred embodiment 1 of the invention.

1, 40, 50, 60, 100 Substrate
2, 2*a*, 2*b*, 2*c*, 2*d*, 101, 110, 111, 112, 113 Soldering land
3, 106 Through-hole
4, 107 Through-hole upper land
5 Pattern
6, 103 BGA
7, 104 Terminal
8, 105 Solder ball
9, 109 Conductor
10, 108 Through-hole upper land
20 Solder
30 Resist layer
31 Soldering land opening
32 Through-hole upper land opening
33 End portion
41 Recess
51 Rib
61 Groove
102 Wiring pattern

DETAILED DESCRIPTION OF THE PREFERRED EMBODIMENTS

Preferred Embodiment 1

FIG. 1 shows configuration of soldering lands and through-hole upper lands in preferred embodiment 1 of the invention.

In FIG. 1, on a principal surface of a printed circuit board 1, soldering lands 2*a*, 2*b*, 2*c*, and 2*d* are formed for connecting terminals of BGA through solder balls. These four soldering lands are arrayed in lattice. Also on the principal surface of the printed circuit board 1, wiring patterns 5 are provided for drawing out the wiring from through-holes 3, through-hole upper lands 4 provided on the through-holes 3, and soldering lands 2*b*, 2*c*, 2*d*, in the outward direction through the principal surface 1*a* of the printed circuit board 1. The through-hole 3 is surrounded by soldering lands 2*a* to 2*d*. In FIG. 1, the number of soldering lands 2*a* of same potential connected to the through-hole upper land 4 is one. As a matter of course, the number of soldering lands of same potential as through-hole 3 is not limited to one. Two or three soldering lands of same potential are described later.

The soldering lands 2*b*, 2*c* and 2*d* are different in potential from the soldering land 2*a*, that is, they are disposed at positions of different potentials. Accordingly, these three soldering lands are not connected to the through-hole upper land 4. That is, in preferred embodiment 1, the soldering land 2*a* is a soldering land of different potential, from the potential of soldering lands 2*b*, 2*c*, 2*d*.

Diagonal line 200*ab* connects central points of soldering lands 2*a* and 2*b*. Diagonal line 200*cd* connects central points of soldering lands 2*c* and 2*d*. Intersecting position of diagonal line 200*ab* and diagonal line 200*cd* is indicated at intersection A.

Central point B of through-hole 3 is eccentric to soldering land 2*a* side by a specified extent from intersection A. What is important herein is that central point B of through-hole 3 is eccentric to soldering land 2*a* side at the same potential, not at the soldering land 2*b* side or 2*c*, 2*d* side. Eccentric extent, that is, the interval from intersection A to central point B of through-hole 3 is, for example, 200 μm in distance. In such configuration, interval L40 between through-hole upper land 4 and soldering lands 2*c*, 2*d* of different potential is about 100 μm, and a necessary distance or interval for assuring electrical insulation can be satisfied.

In FIG. 1, the through-hole upper land 42 indicates the position employed in a conventional printed circuit board. In this configuration, the central point of through-hole upper land 42 is matched with intersection A. Therefore, the interval L42 of through-hole upper land 42 and soldering lands 2*b*, 2*c* and 2*d* is about 66 μm as mentioned in the prior art, and this distance or interval is not sufficient for satisfying the electrical insulation.

In preferred embodiment 1, it is the basic condition that through-holes 3 of conventional size are used. In addition, the position of through-hole 3 is determined in order to assure a specific distance from the soldering lands 2*b*, 2*c* and 2*d* of different potential.

Supposing the distance from the central point of soldering lands of different potential to the central point of through-hole to be α, the radius of soldering land to be rS, the radius of through-hole upper land to be rTL, and the minimum distance required between the soldering land of different potential and the through-hole upper land to be Y, the position of through-hole 3 is determined to satisfy formula 1.

$$\alpha > rS + Y + rTL \quad \text{(formula 1)}$$

When the central point B of through-hole 3 is set in the area specified formula 1, specified distance Y can be held between the through-hole upper land 4 and soldering lands 2*b*, 2*c*, 2*d* of different potential.

However, when the through-hole 3 and soldering land 2*a* of same potential are overlapped, solder may flow into the through-hole 3, or the soldering land may be defective due to deviation of position when processing through-holes. In view of this point, supposing the distance from the central point of soldering land of same potential to the central point of through-hole to be β, and the radius of through-hole to be rT, it is desired to satisfy the condition of formula 2.

$$\beta > rS + rT \quad \text{(formula 2)}$$

Figure 2:
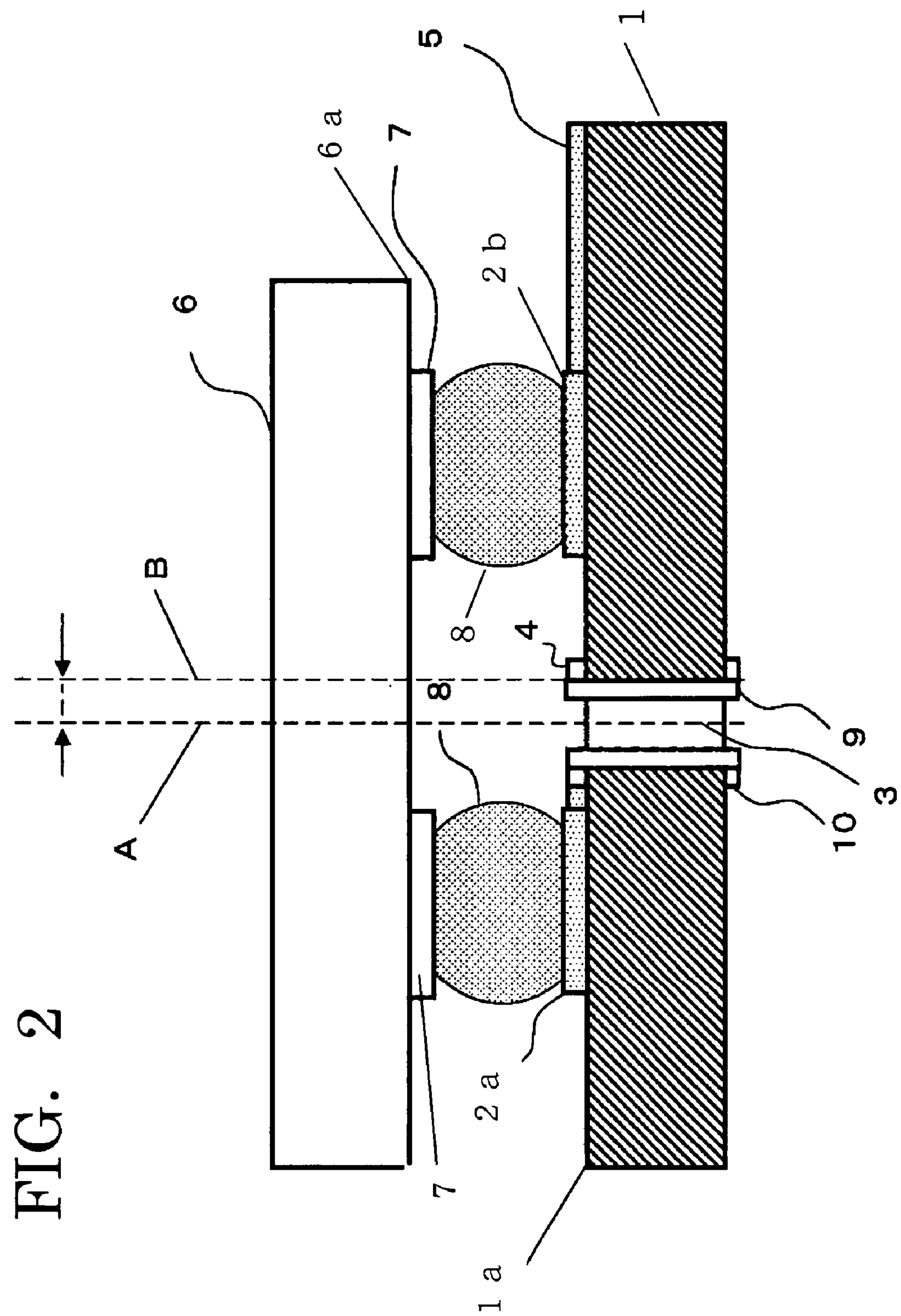
FIG. 2 is a sectional view of printed circuit board in preferred embodiment 1 of the invention.

FIG. 2 is a sectional view of printed circuit board 1 shown in FIG. 1, cut off along diagonal line 200*ab* passing through the through-hole 3 out of the diagonal lines linking the centers of soldering lands 2*a* to 2*d*.

FIG. 2 shows a BGA 6 of the invention. Terminals 7 are provided on a principal surface 6*a* of BGA 6 in lattice at pitch of, for example, 0.8 mm. Solder balls 8 are connected to terminals 7. Conductors 9 are formed in the inner wall of through-hole 3. Through-hole lower lands 10 are provided in the lower part of through-hole 3.

At the principal surface 1*a* side of the printed circuit board 1, soldering lands 2*a*, 2*b* and wiring patterns 5 are formed. Solder balls 8 are connected to soldering lands 2*a*, 2*b*. By way of wiring patterns 5, specified terminals of IC mounted on the BGA 6 are drawn to outside of BGA. From the through-hole upper land 4, they are further guided into the through-hole lower land 10 through conductors 9 provided in the inner wall of the through-hole 3.

In FIG. 2, intersection A denotes the crossing point of diagonal line 200*ab* and diagonal line 200*cd* as mentioned above. Center of through-hole 3 is indicated as central point 3.

Figure 3:
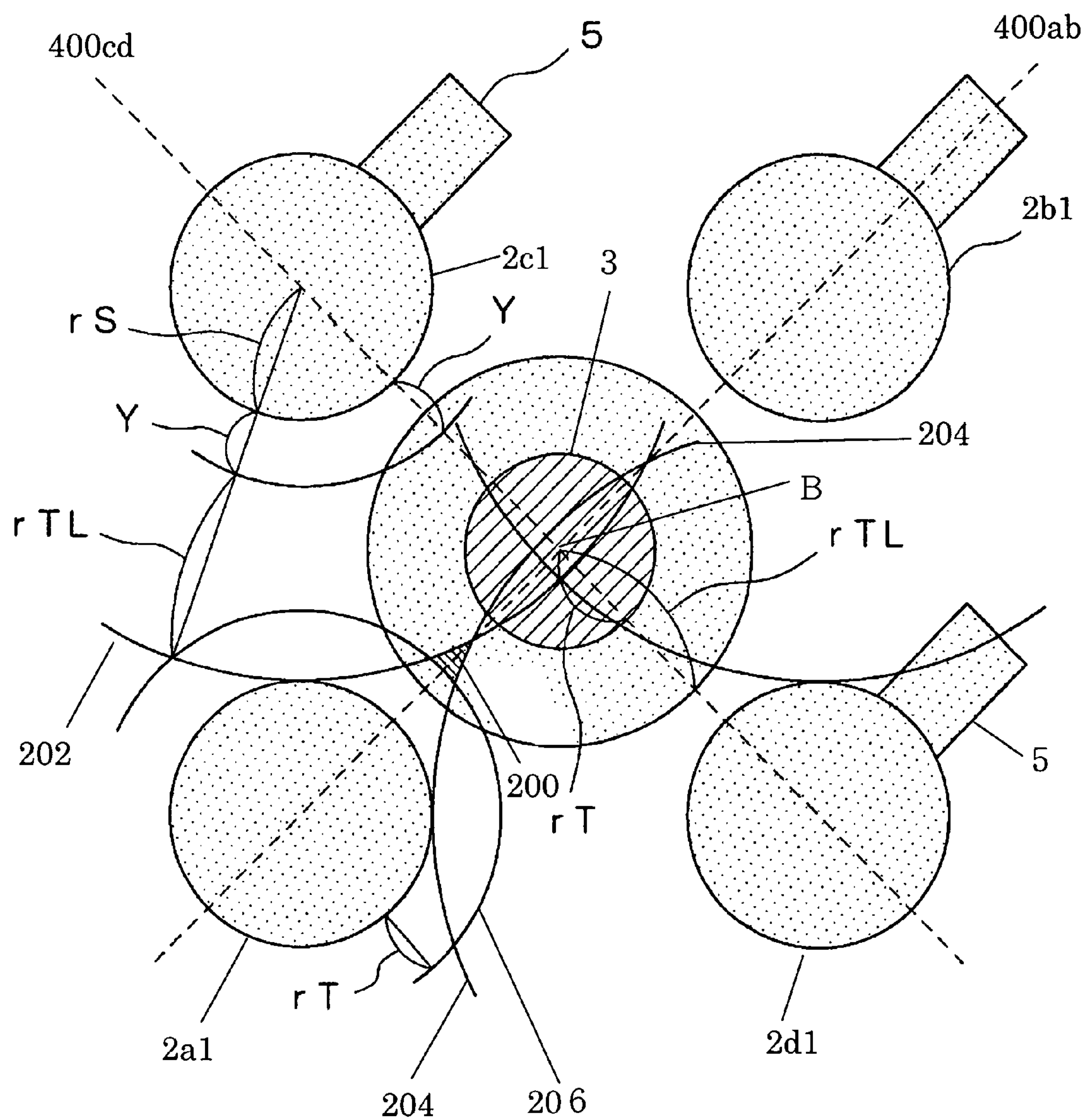
FIG. 3 is a diagram showing movable area of through-holes in preferred embodiment 1 of the invention.

FIG. 3 is a diagram showing movable area of through-hole 3 in preferred embodiment 1. The movable area is a region for setting central point of through-hole 3.

In FIG. 3, the range satisfying the conditions of formula 1 and formula 2 is indicated as area 200. The area 200 specified by formula 1 and formula 2 is an area enclosed by three line segments. First line segment 202 is a circle concentric with soldering land 2*c*1, and part of circle of which radius is (rS+Y+rTL). Second line segment 204 is a circle concentric with soldering land 2*d*1, and part of circle of which radius is (rS+Y+rTL). Third line segment 206 is a circle concentric with soldering land 2*a*1, and part of circle of which radius is (rS+rT). Herein, rS, Y, rTL and rT are same as used in formula 1 and formula 2.

Area 200 enclosed by these three line segments satisfies both formula 1 and formula 2. The position of through-hole 3 may be determined so that the central point of through-hole 3 may be present inside of area 200.

Thus, by disposing the through-hole 3 enclosed by three soldering lands 2*b*1, 2*c*1, and 2*d*1 of different potentials and one soldering land 2*a*1 of same potential, closely to the side of soldering land 2*a* of same potential, distance (interval) can be sufficiently provided between the soldering lands 2*b*, 2*c*, and 2*c*, even by using the through-hole 3 of conventional diameter size used in connection of BGA of wide pitch.

Figure 17B:
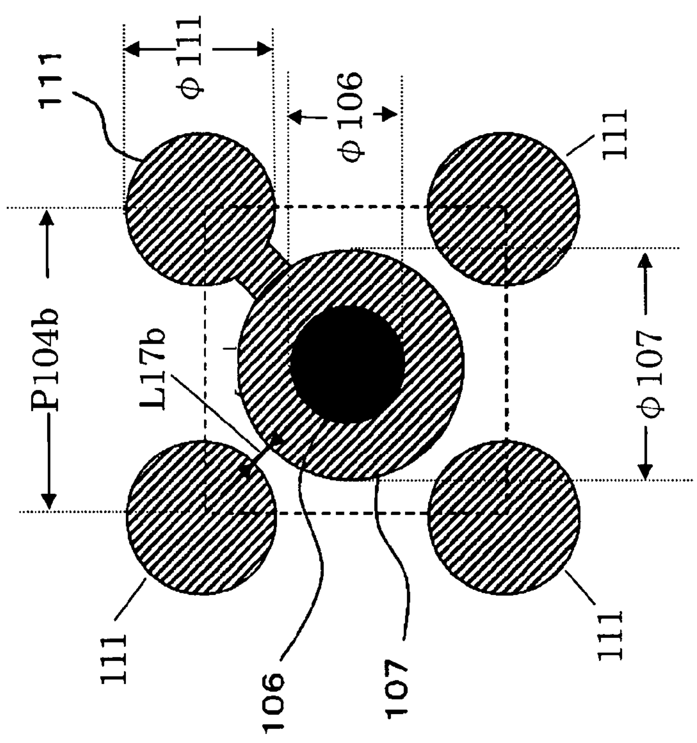
FIG. 17B is a diagram showing other printed circuit board in prior art.
Figure 17A:
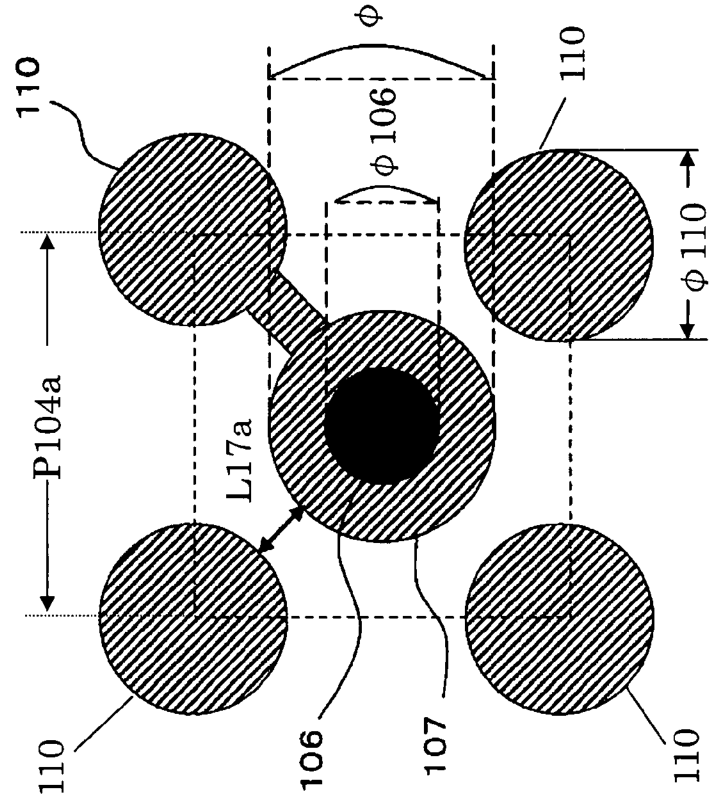
FIG. 17A is a diagram showing a printed circuit board in prior art.
Figure 18:
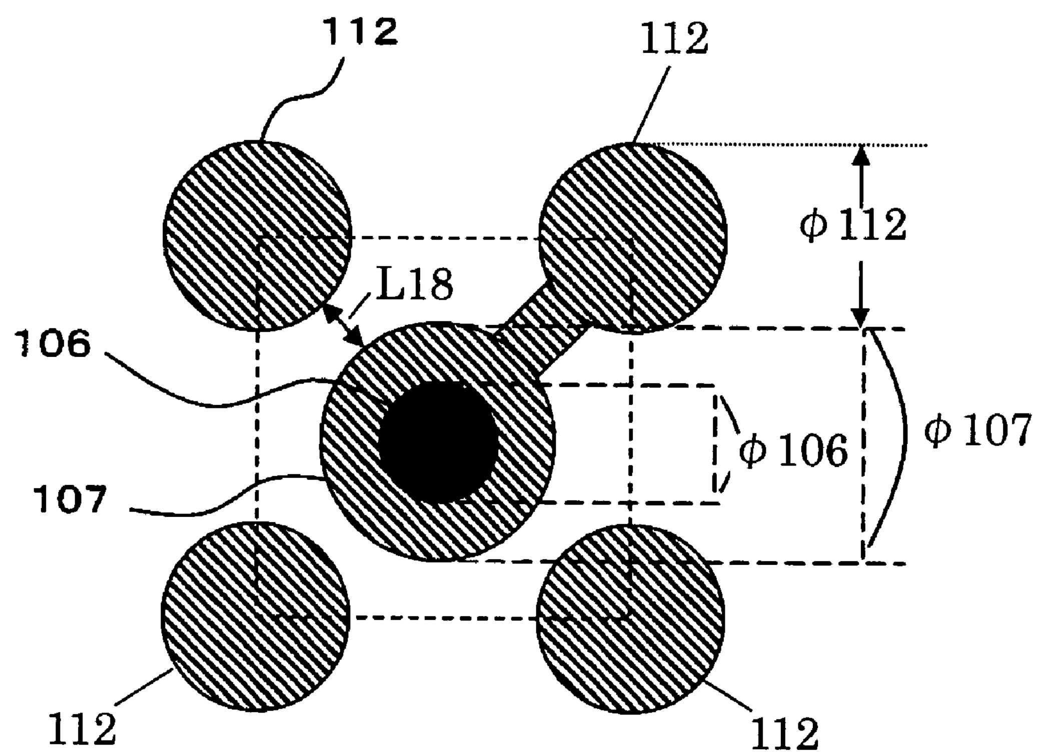
FIG. 18 is a diagram showing an example of printed circuit board in prior art.
Figure 19:
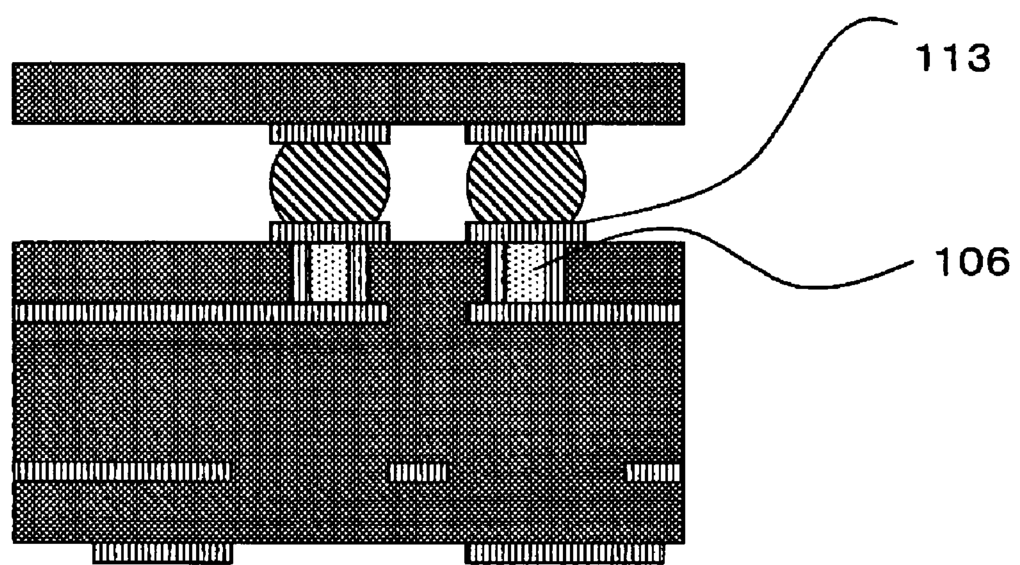
FIG. 19 is a sectional view of printed circuit board in prior art.
Figure 20:
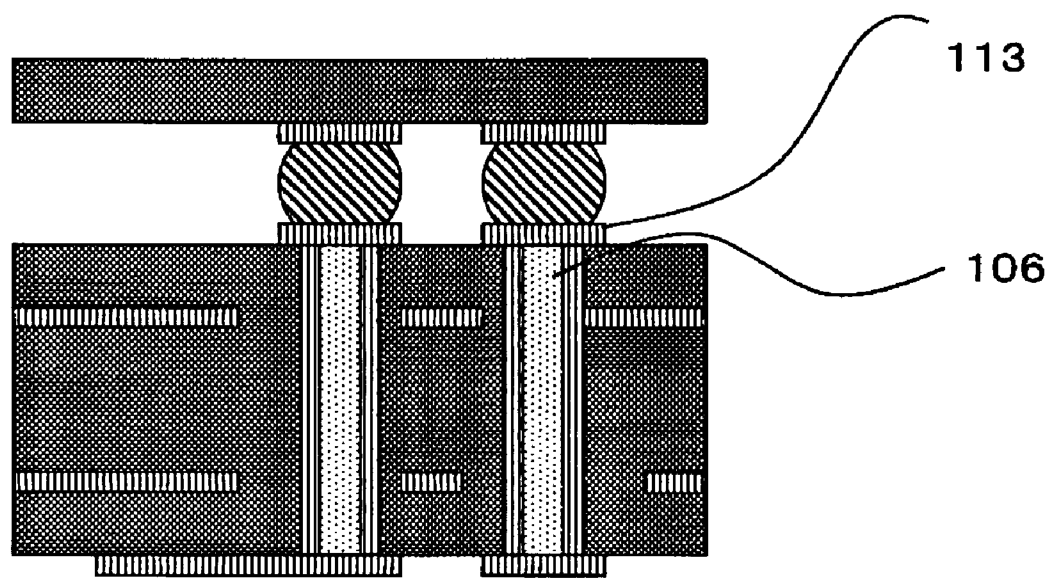
FIG. 20 is a sectional view of printed circuit board in prior art.
Figure 21:
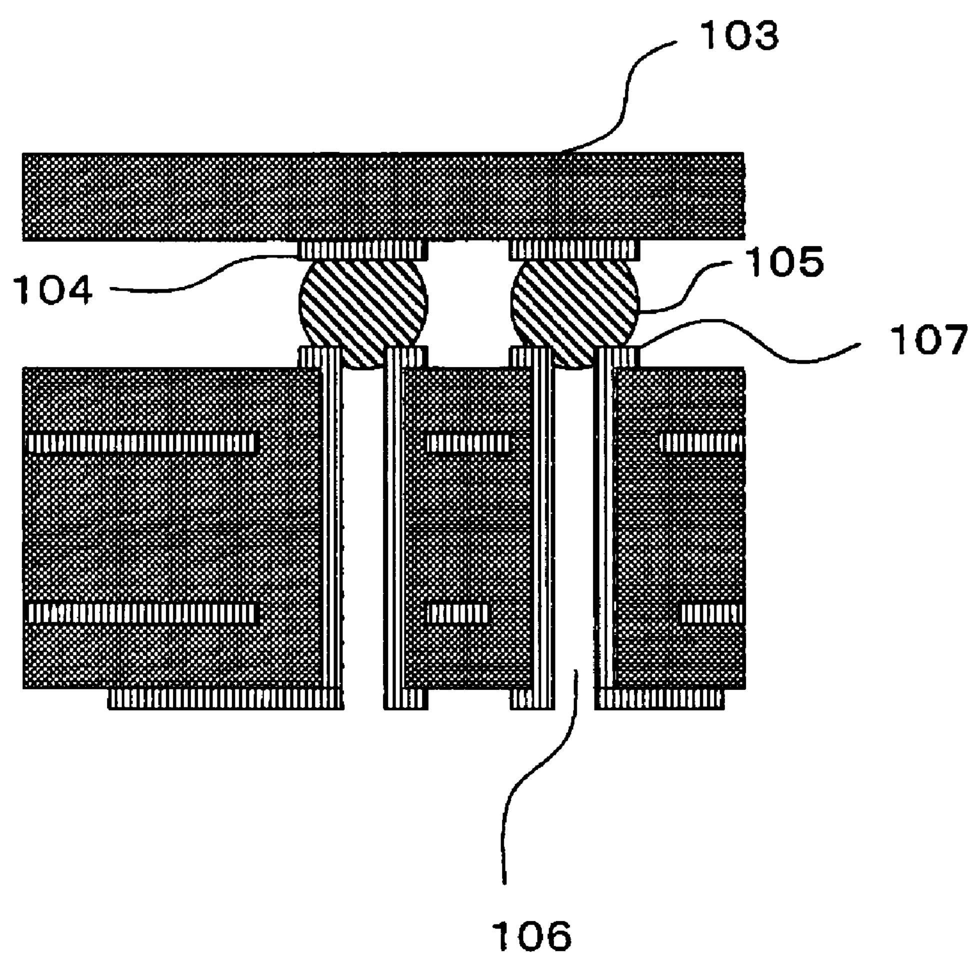
FIG. 21 is a sectional view of printed circuit board in prior art.

More specifically, diameter ϕ3 of through-hole 3 is 0.3 mm, and diameter 4 of through-hole upper land 4 is 0.6 mm. The through-hole 3 and through-hole upper land 4 could be hardly used in conventional printed circuit board mounting BGA of 0.8 mm pitch. The reason is, as mentioned in the background art referring to FIG. 17A and FIG. 17B, only about 66 μm could be assured as insulation distance for preventing electrical short-circuit accident between the through-hole upper land and soldering land.

On the other hand, according to the configuration of preferred embodiment 1 of the invention, the through-hole and through-hole upper land of this size can be used in the printed circuit board mounting BGA of 0.8 mm pitch. It is hence possible to avoid cost increase due to reduction of diameter of through-hole or diameter of through-hole upper land.

Preferred Embodiment 1 of the invention is described herein. But the invention is not limited to preferred embodiment 1 alone. The invention may be also carried out in other examples below.

Other Example 1 of Preferred Embodiment 1

Figure 4:
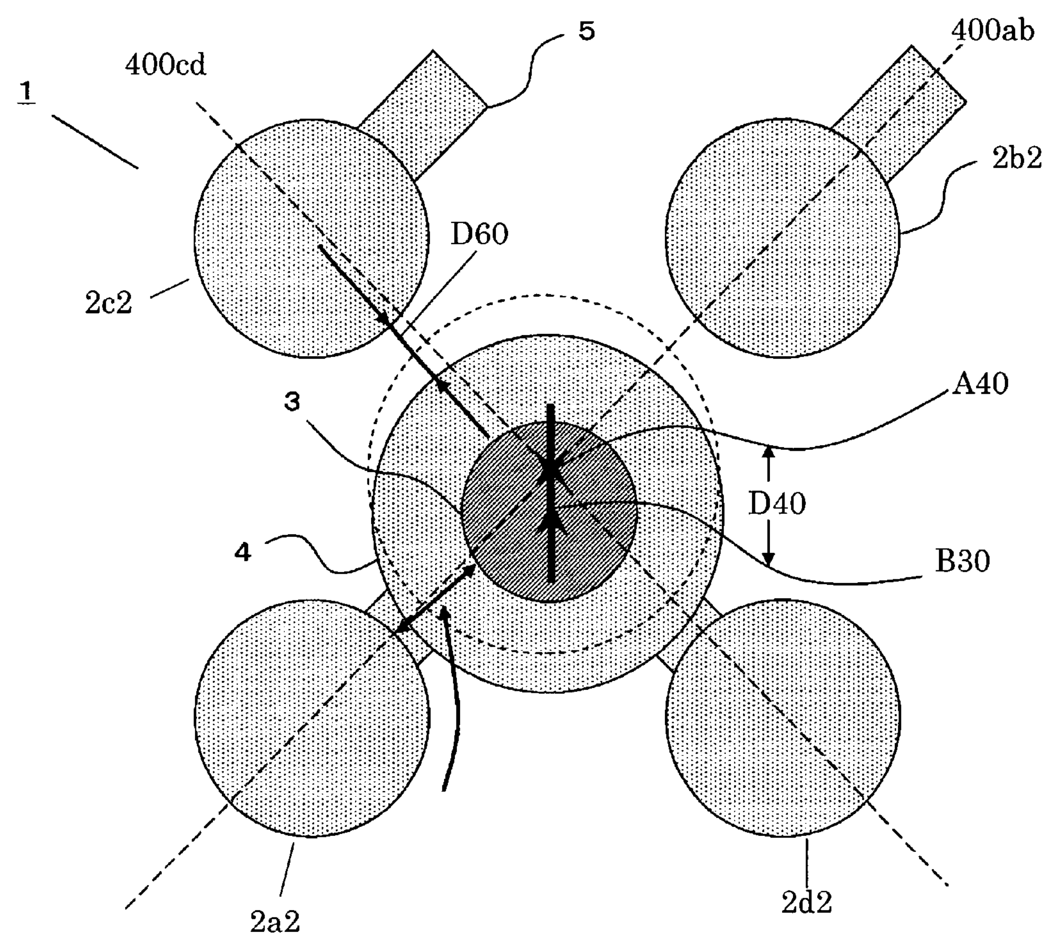
FIG. 4 is a diagram showing other form of printed circuit board in preferred embodiment 1 of the invention.

FIG. 4 is a diagram showing other form of printed circuit board in preferred embodiment 1. Four soldering lands 2*a*2, 2*b*2, 2*c*2, and 2*d*2 are disposed in lattice. FIG. 4 shows two soldering lands 2*a*2, 2*d*2 of same potential as through-hole upper land 4. The soldering lands 2*b*2, 2*c*2, and the soldering lands 2*a*2, 2*d*2 are different in potential, that is, they are formed as soldering of different potential. Diagonal line 400*ab* links centers of soldering lands 2*a*2 and 2*b*2. Diagonal line 400*cd* links centers of soldering lands 2*c*2 and 2*d*2. The crossing point of diagonal line 400*ab* and diagonal line 400*cd* is shown as intersection A40. The central point B30 of through-hole 3 is eccentric by specified extent in vertical downward direction from intersection A40 in front view of FIG. 4. In FIG. 4, the reason of being eccentric in vertical downward direction is that the soldering lands 2*a*2 and 2*d*2 of same potential as through-hole 3 are present in this direction. That is, the eccentric direction is deviation toward the soldering land side of same potential. The eccentric extent D40 is, for example, 46 μm. In this configuration, a more than a specified interval (distance) is provided between the soldering lands 2*b*2, 2*c*2 of different potential and through-hole upper land 4. In this preferred embodiment, the interval D60 is specified to be a distance of 100 μm or more.

In this way, when there are two soldering lands (2*a*2, 2*d*2) of same potential, the through-hole 3 is set eccentric toward the center direction of these soldering lands, and even in a shorter moving distance than in preferred embodiment 1, a sufficient interval is preserved between soldering lands 2*b*2, 2*c*2 of different potential.

Figure 5:
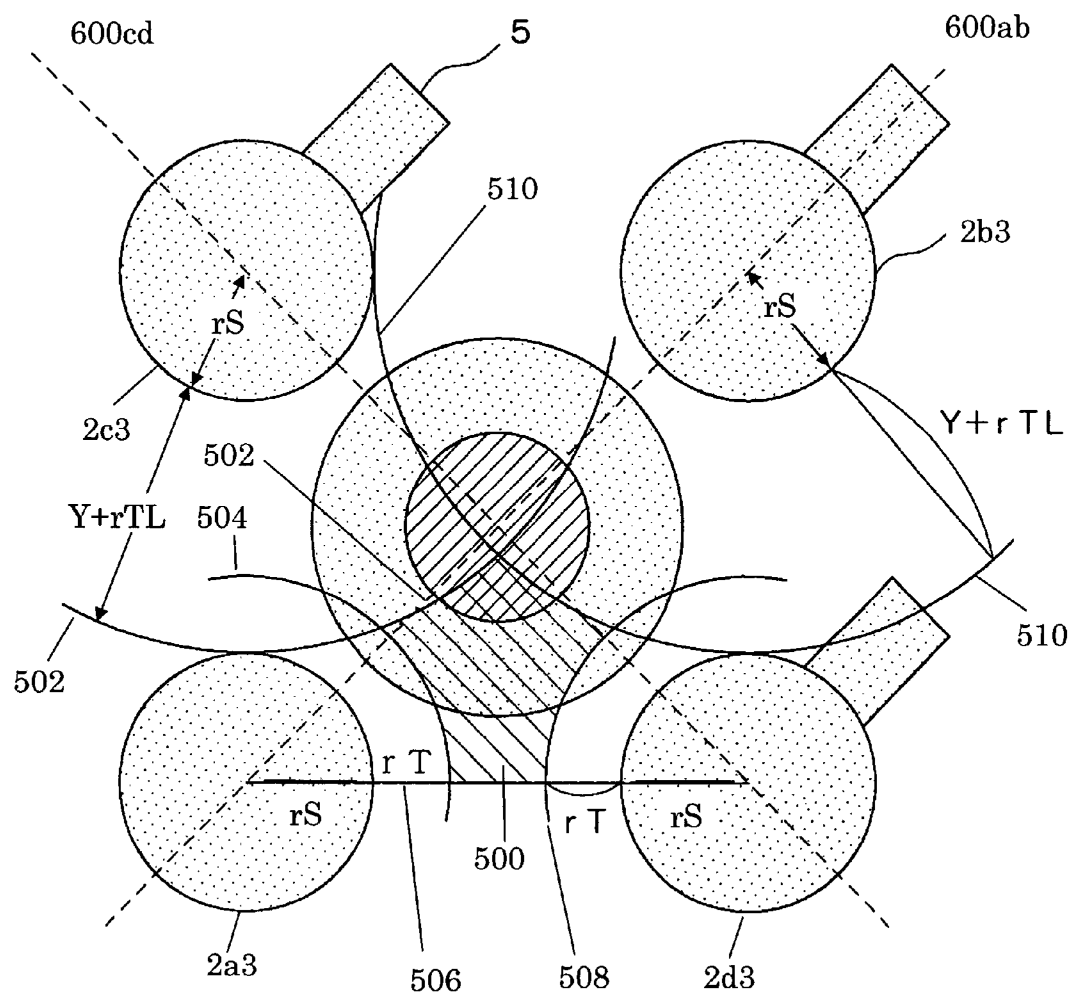
FIG. 5 is a diagram showing movable area of through-holes in preferred embodiment 1 of the invention.

In this case, too, the position of through-hole 3 may be determined so that the central point B30 of through-hole 3 may be present within the area satisfying the conditions of formula 1 and formula 2. The area specified by formula 1 and formula 2 is shown in FIG. 5. That is, in FIG. 5, the area satisfying the conditions of formula 1 and formula 2 is indicated as area 500. The area 500 is enclosed by five line segments. First line segment 502 is a circle concentric with soldering land 2*c*3, and part of circle of which radius is (rS+Y+rTL). Second line segment 504 is a circle concentric with soldering land 2*a*3, and part of circle of which radius is (rS+rT). Third line segment 506 is a straight line linking the centers of soldering lands 2*a*3 and 2*d*3. Fourth line segment 508 is a circle concentric with soldering land 2*d*3, and part of circle of which radius is (rS+rT). Fifth line segment 510 is a circle concentric with soldering land 2*b*3, and part of circle of which radius is (rS+Y+rTL). Diagonal line 600*ab* links the central points of soldering lands 2*a*3 and 2*b*3. Diagonal line 600*cd* links the central points of soldering lands 2*c*3 and 2*d*3.

Herein, Y, rTL, rS and rT are same as used in formula 1 and formula 2, and also same as explained in FIG. 3.

Area 500 enclosed by these five line segments is set as an area satisfying both formula 1 and formula 2. The position of through-hole 3 may be determined so that the central point of through-hole 3 may be present inside of area 500.

Thus, when two out of plural soldering lands 2*a*3 to 2*d*3 surrounding the through-hole 3 are of same potential, by disposing the through-hole 3 closer to the central position of two soldering lands 2*a*3, 2*d*3 of same potential, more than a specified distance can be kept between soldering lands 2*b*3, 2*c*3 of different potentials. As a result, electrical short-circuiting of soldering lands of different potentials can be prevented. In this case, as compared with one soldering land of same potential, the movable area of through-hole 3 can be expanded, and moving distance of through-hole 3 is shorter, so that the degree of freedom of circuit design is enhanced.

Not disposing closer to a specific soldering land, a certain distance can be kept between two soldering lands of same potential (2*a*3 and 2*d*3 in FIG. 5), and defect of soldering land 2 by flow of solder into through-hole 3 or deviation of position due to processing of through-hole 3 can be avoided.

Other Example 2 of Preferred Embodiment 1

Figure 6:
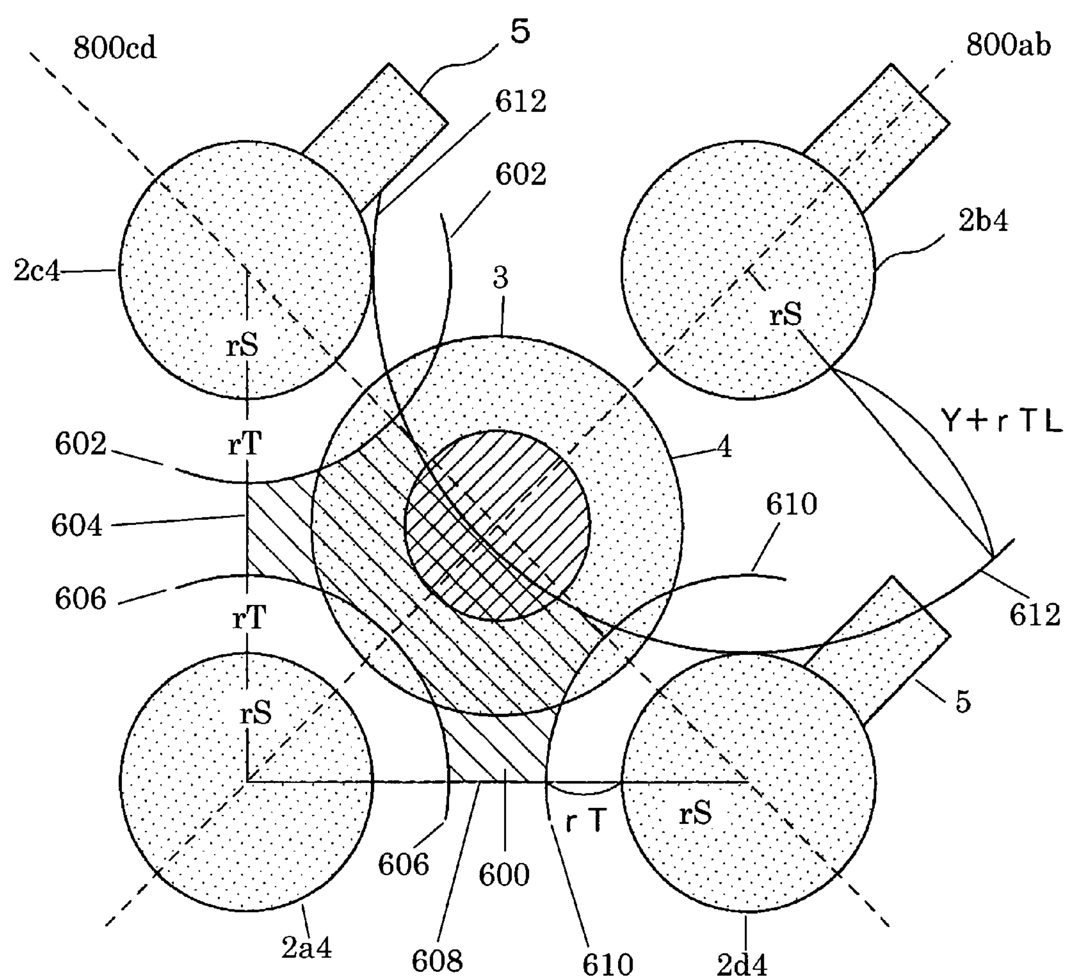
FIG. 6 is a diagram showing movable area of through-holes in preferred embodiment 1 of the invention.

FIG. 6 is a diagram showing a other example 2 of preferred embodiment 1. In FIG. 6, three soldering lands are of same potential as through-hole upper land 4, and the remaining one is of different potential. Diagonal line **800*ab* links the central points of soldering lands 2*a*4 and 2*b*4. Diagonal line 800*cd* links the central points of soldering lands 2*c*4 and 2*d*4. In this case, the area 600 specified by formula 1 and formula 2 is as shown in FIG. 6. That is, the position of through-hole 3 is determined so that the central point of through-hole 3 may be present in the area 600**.

In FIG. 6, the area satisfying the conditions of formula 1 and formula 2 is indicated as area 600. The area 600 is enclosed by six line segments. First line segment 602 is a circle concentric with soldering land **2*c*4, and part of circle of which radius is (rS+rT). Second line segment 604 is a straight line linking the central points of soldering lands 2*c*4 and 2*a*4. Third line segment 606 is a circle concentric with soldering land 2*a*4, and part of circle of which radius is (rS+rT). Fourth line segment 608 is a straight line linking the central points of soldering lands 2*a*4 and 2*d*4. Fifth line segment 610 is a circle concentric with soldering land 2*d*4, and part of circle of which radius is (rS+rT). Sixth line segment 612 is a circle concentric with soldering land 2*b*4**, and part of circle of which radius is (rS+Y+rTL).

Herein, rS, rT, Y and rTL are same as used in formula 1 and formula 2, and also same as explained in FIG. 3 and FIG. 5.

Area 600 enclosed by these six line segments is set as an area satisfying both formula 1 and formula 2. The position of through-hole 3 may be determined so that the central point may be present inside of area 600.

Thus, when three out of plural soldering lands **2*a*4 to 2*d*4 surrounding the through-hole 3 are of same potential, by disposing the through-hole 3 closer to the central position of three soldering lands 2*a*4, 2*c*4, 2*d*4 of same potential, more than a specified distance can be kept from the other soldering land 2*b*4 of different potential. That is, the through-hole 3 is set eccentric toward a direction departing from the soldering land 2*b*4 of different potential. As a result, electrical short-circuiting of soldering lands of different potentials can be prevented. In this case, as compared with one soldering land of same potential, the movable area of through-hole 3 can be expanded, and moving distance of through-hole 3** is shorter, so that the degree of freedom of circuit design is enhanced.

That is, as compared with the foregoing examples of one or two soldering lands 2 of same potential, the movable area of through-hole 3 is further expanded. Hence, the degree of freedom of circuit design is enhanced. Besides, not disposing closer to a specific soldering land, flow of solder into through-hole 3 or defect of soldering lands (**2*a*4, 2*c*4, 2*d*4**) can be avoided.

Moreover, in preferred embodiment 1, four sides of through-hole 3 are surrounded by soldering lands. But if only three sides of through-hole 3 are surrounded by soldering lands, same effects as in the preferred embodiment of the invention are obtained.

Figure 7:
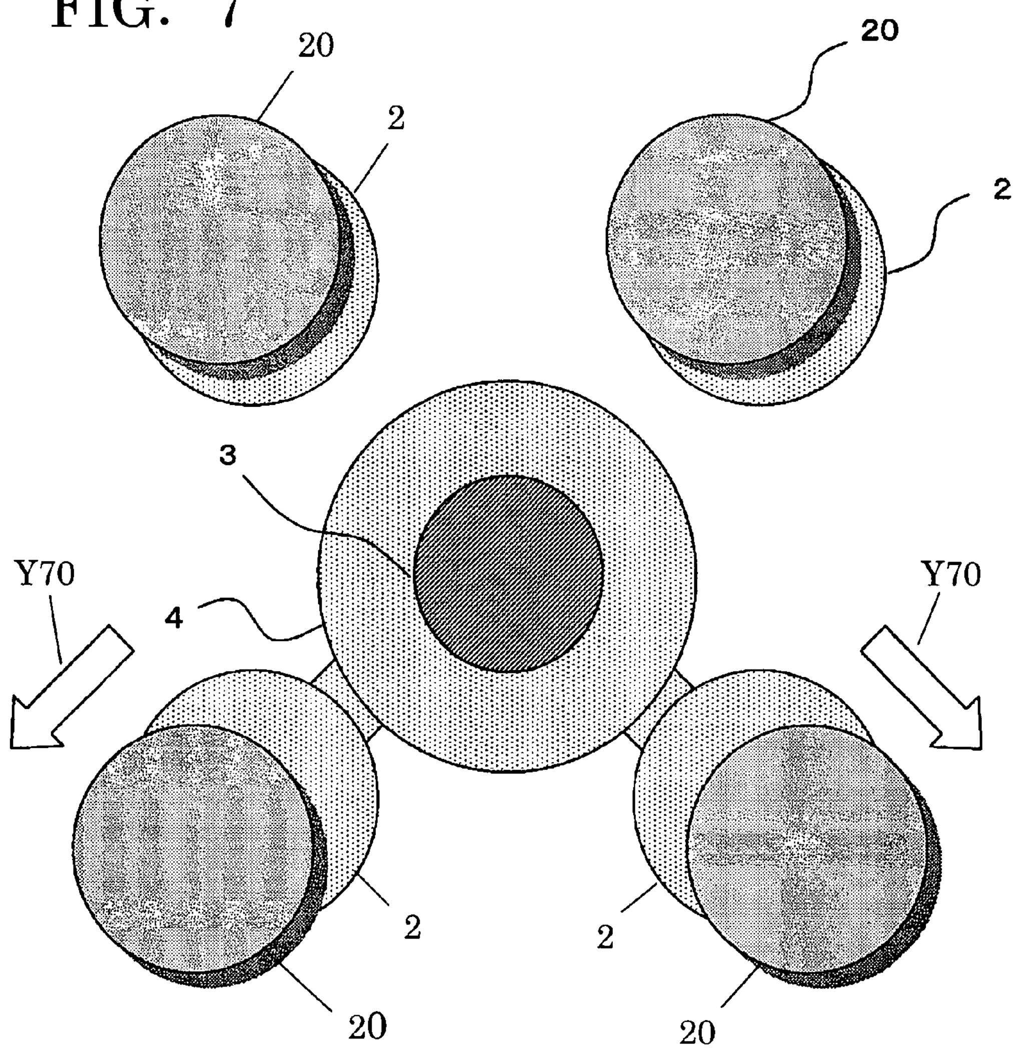
FIG. 7 is a diagram showing other form of printed circuit board in preferred embodiment 1 of the invention.

In the area specified by formula 1 and formula 2, the through-hole 3 and the soldering land of same potential may be close to each other. In such a case, as shown in FIG. 7, in the manufacturing process of printed circuit board, printing position of solder 20 on the soldering land 2 of same potential may be deviated in any direction Y70 departing from the through-hole 3 in a range not having effects on the soldering land 2 existing in other range.

As a result, flow of solder 20 into through-hole 3 is prevented. In this case, immediately after solder printing, the solder 20 is projecting out of the soldering land 2, but in reflow solder, when the solder 20 is fused, the entire solder 20 is attracted into the central direction of soldering land 2 by the wettability of printed solder 20 and solder balls 8 of soldering land 2 or BGA 6. Therefore, while suppressing possibility of occurrence of short-circuiting with other soldering land 2 existing in the surrounding, flow of solder into through-hole 3 can be prevented.

As in preferred embodiment 1, when plural soldering lands are at same potential, such soldering lands may be power source terminals or ground terminals each other. Or they may be signal terminals of same type, or blank terminal and other usable terminal (hereinafter called TNC terminals).

Figure 8:
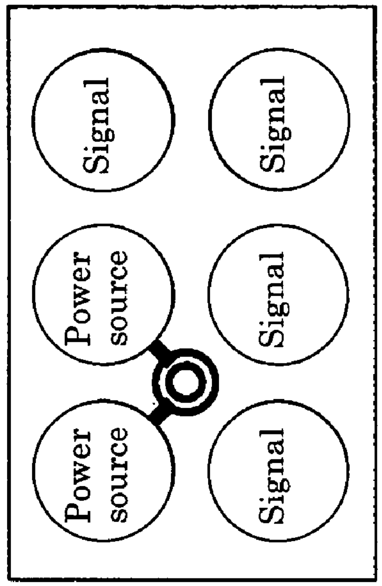
FIG. 8 is a terminal array diagram of BGA in preferred embodiment 1 of the invention.
Figure 8:
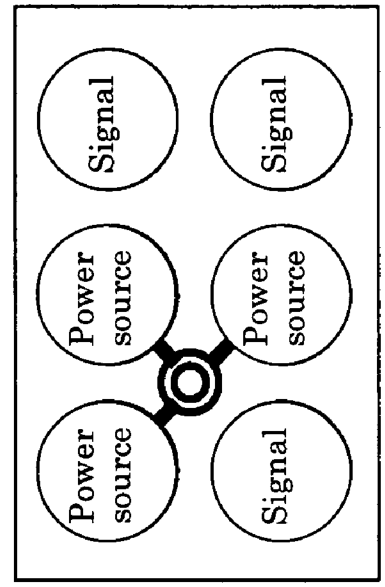
Figure 8:
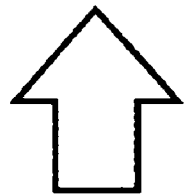
Figure 8:
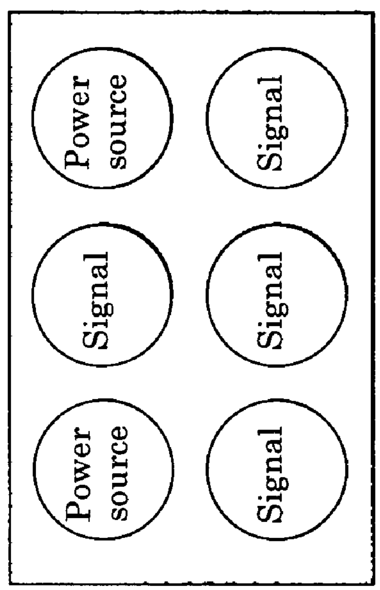

In this case, terminals 7 can be disposed according to the layout of soldering lands on the printed circuit board 1 from the package designing stage of BGA 6. For example, as shown in FIG. 8, when power source terminals are connected in parallel, two or three or more of soldering lands surrounding the four sides are different from the soldering land of same potential, and the degree of freedom of determining the position of through-hole 3 may be enhanced.

In preferred embodiment 1, BGA is shown as an example, but the invention may be executed in other package forming connection terminals in lattice, such as similar CSP (chip scale package) or package not having solder ball called LGA (land grid array).

Preferred Embodiment 2

Figure 9:
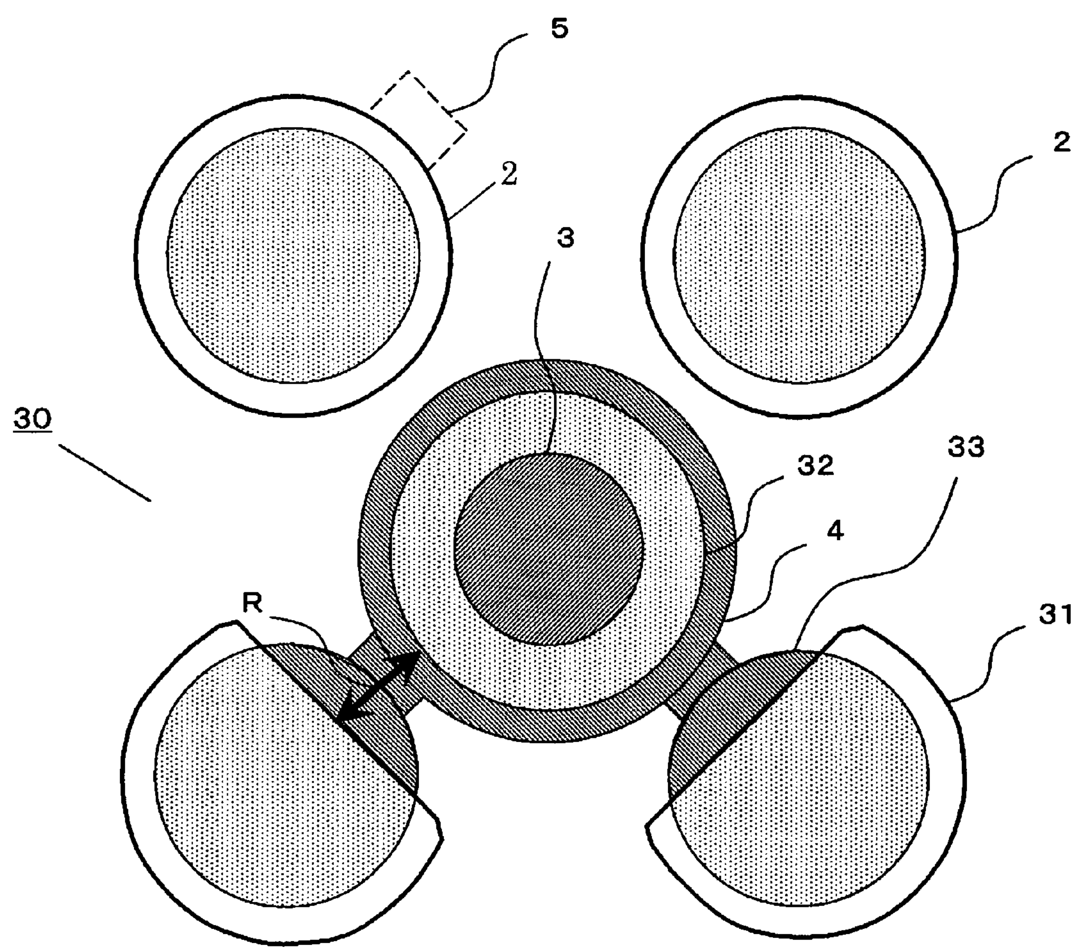
FIG. 9 is a diagram of printed circuit board in preferred embodiment 2 of the invention.

FIG. 9 is a diagram explaining a state of putting resist layer 30 on to cover the printed circuit board 1 explained in preferred embodiment 1 of the invention.

FIG. 9 shows a soldering land opening 31 of resist provided on soldering land 2, and a through-hole upper land opening 32 of resist provided on the through-hole upper land 4.

In the manufacturing process of printed circuit board, generally, a resist layer 30 is applied on printed circuit board 1, soldering land 2, through-hole upper land 4, and pattern 5 in order to prevent solder short-circuiting between lands and flow of solder into through-hole 3. At this time, for connection with terminals 7 of BGA 6, soldering land opening 31 is formed on the top of soldering land 2. On the top of through-hole upper land 4, through-hole upper land opening 32 is provided so that resist layer 30 may not get in.

Resist 30 covering the top of soldering land 2 of same potential connected to through-hole upper land 4 further covers the top of soldering land 2 by the excess portion of end portion 33 at the side of through-hole upper land 4. Other elements are same as in preferred embodiment 1, and detailed description is omitted.

As explained in preferred embodiment 1, since the through-hole upper land 4 is eccentric to the position close to the soldering land 2 of same potential, distance R between soldering land opening 31 and through-hole upper land opening 32 is also narrow. However, if the resist layer 30 is too thin, it may be broken, and the width must be depth at, for example, 100 μm or more. In preferred embodiment 2, by cutting off part of soldering land opening 31 on the top of soldering land 2, distance R of 100 μm or more is maintained between the through-hole upper land opening 32 and soldering land opening 31.

As a result, a sufficient distance is kept between the through-hole upper land opening 32 and soldering land opening 31, defect of resist layer 30 is prevented, and short-circuiting of through-hole upper land 4 and soldering land 2 can be prevented.

In preferred embodiment 2, the distance between the through-hole upper land opening 32 and soldering land opening 31 is 100 μm, but this is only an example, and the distance may be set freely within a possible design change range known for those skilled in the art.

Preferred Embodiment 2 of the invention is explained so far, but the invention is not limited to preferred embodiment 2 alone.

Other Example of Preferred Embodiment 2

Figure 10:
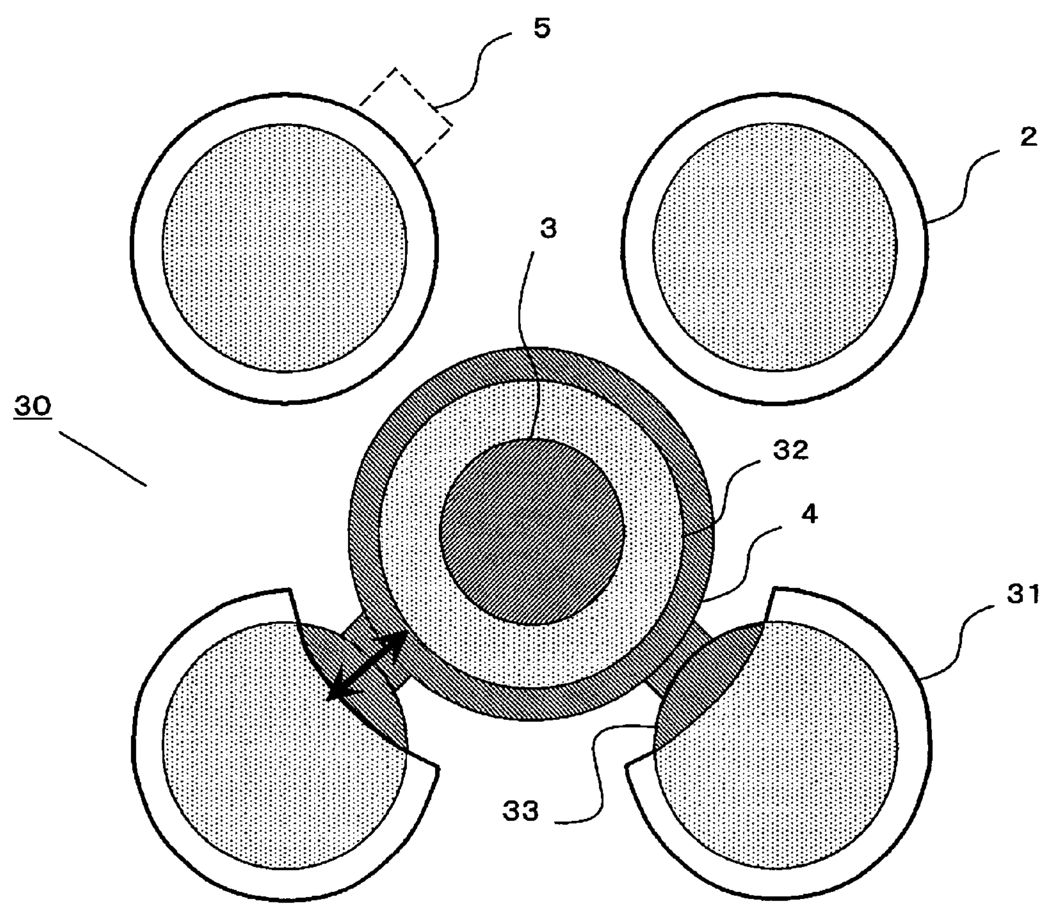
FIG. 10 is a diagram showing other form of printed circuit board in preferred embodiment 2 of the invention.

FIG. 10 shows other example of preferred embodiment 2. Part of soldering land opening 31 is cut off, and the shape is formed into an arc concentric with through-hole 3. As a result, the distance is kept constant between the soldering land opening 31 and through-hole upper land opening 32. According to this method, as compared with the case of cutting part of soldering land opening 31 straightly, the copper foil exposure area of soldering land 2 can be expanded.

Soldering lands 2 having soldering land opening 31 of cut shape are present in a plurality in entire circuit, as power source, ground or NC. It is also possible to design receive terminals not immediately leading to operation failure if falling in unconnected state. Since the soldering land opening 31 is formed in a cut shape, the soldering area is decreased as compared with the soldering land 2 of same potential. By using such terminals in the soldering land, as compared with lands of intrinsic signal terminals, if connection failure occurs early, it does not lead directly to failure of entire circuit, and the circuit operation is maintained in specified normal state.

Figure 11:
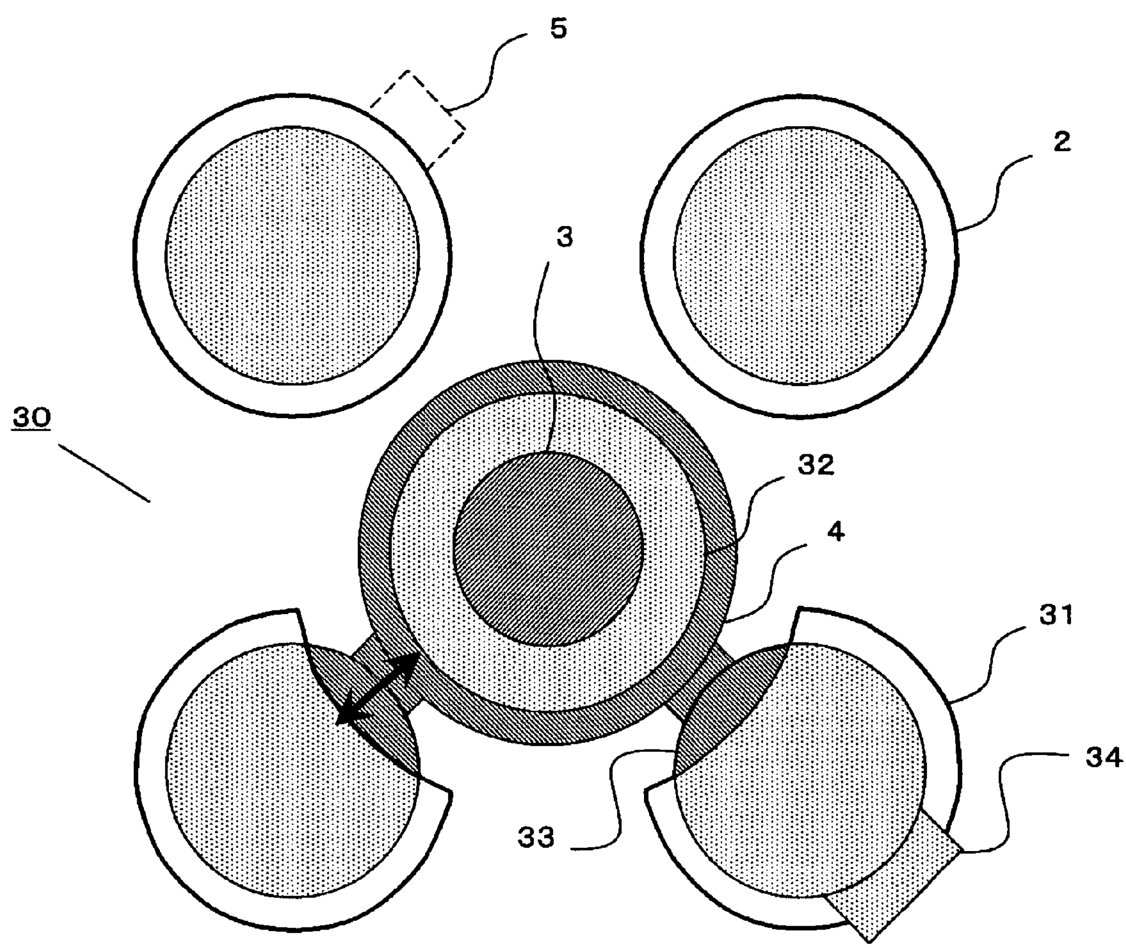
FIG. 11 is a diagram showing other form of printed circuit board in preferred embodiment 2 of the invention.

To lower the possibility of such connection failure, as shown in FIG. 11, the resist layer 30 is cut in other direction than the direction of end portion 33 of through-hole upper land 4 side partly cut off, out of the soldering land opening 31, and copper foil 34 is provided in this region, and decrease in copper foil exposure area can be complemented. Thus, by increasing the copper foil exposure area, connection failure can be prevented. If the partly cut-off soldering land opening 31 is a ground terminal or the like, and is connected to other soldering land 2 by pattern 5, an extra copper foil exposure area can be obtained only by extending the resist on the pattern 5, and same effects as when adding copper foil 34 are obtained.

Preferred Embodiment 3

Figure 12:
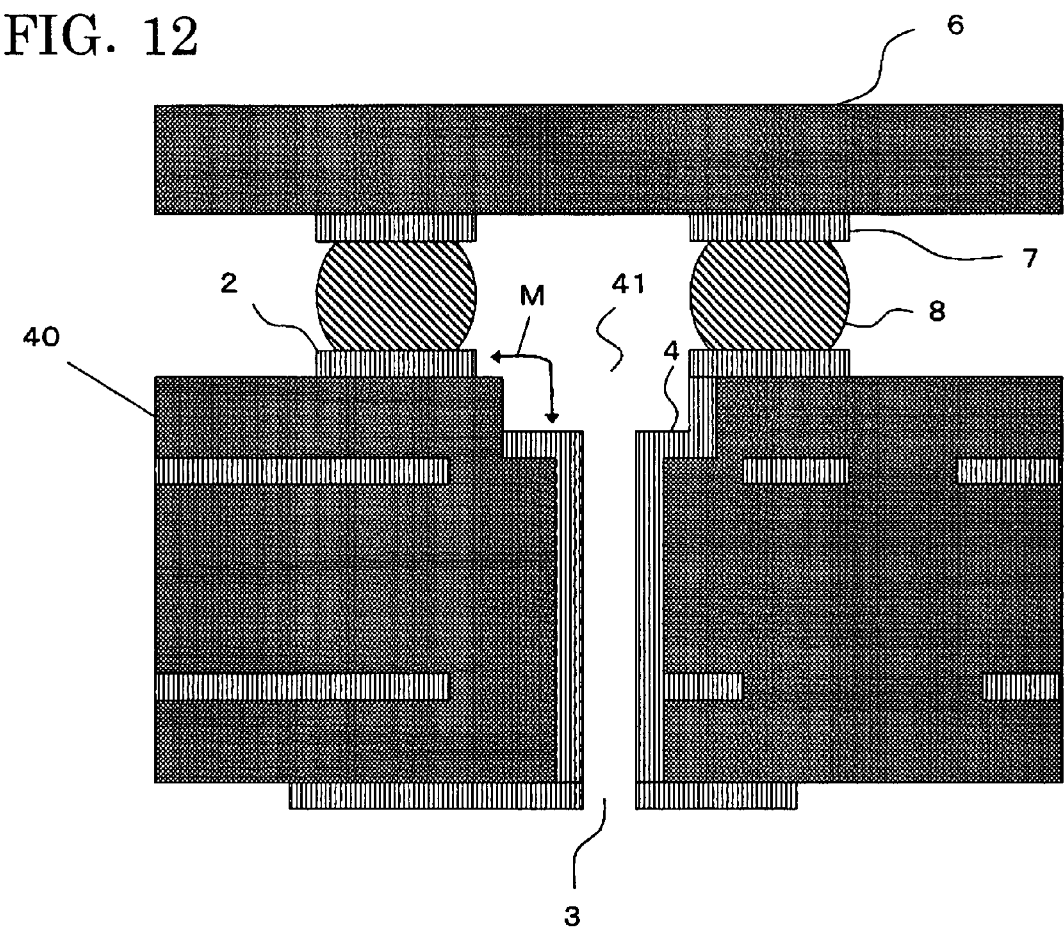
FIG. 12 is a diagram showing other form of printed circuit board in preferred embodiment 3 of the invention.

FIG. 12 is a sectional view of printed circuit board 40 in preferred embodiment 3 of the invention.

In FIG. 12, a recess 41 is formed on the top surface of through-hole 3 of printed circuit board 40. Through-hole upper land 4 is formed in the bottom of the recess 41. The recess 41 is formed after forming the through-hole 3, by additionally cutting to an intermediate depth in a hole one size larger than the through-hole 3. In preferred embodiment 3, the diameter of through-hole 3 is same as the conventional size.

Thus, by forming the through-hole upper land 4 beneath the soldering land 2 on the printed circuit board 40, if the through-hole 3 of conventional size is used, distance M between soldering land 2 of different potential and through-hole upper land 4 can be maintained at a specified value (for example, 100 μm).

The recess 41 is not limited to cylindrical shape, and may include, for example, bowl shape.

Preferred Embodiment 4

Figure 13:
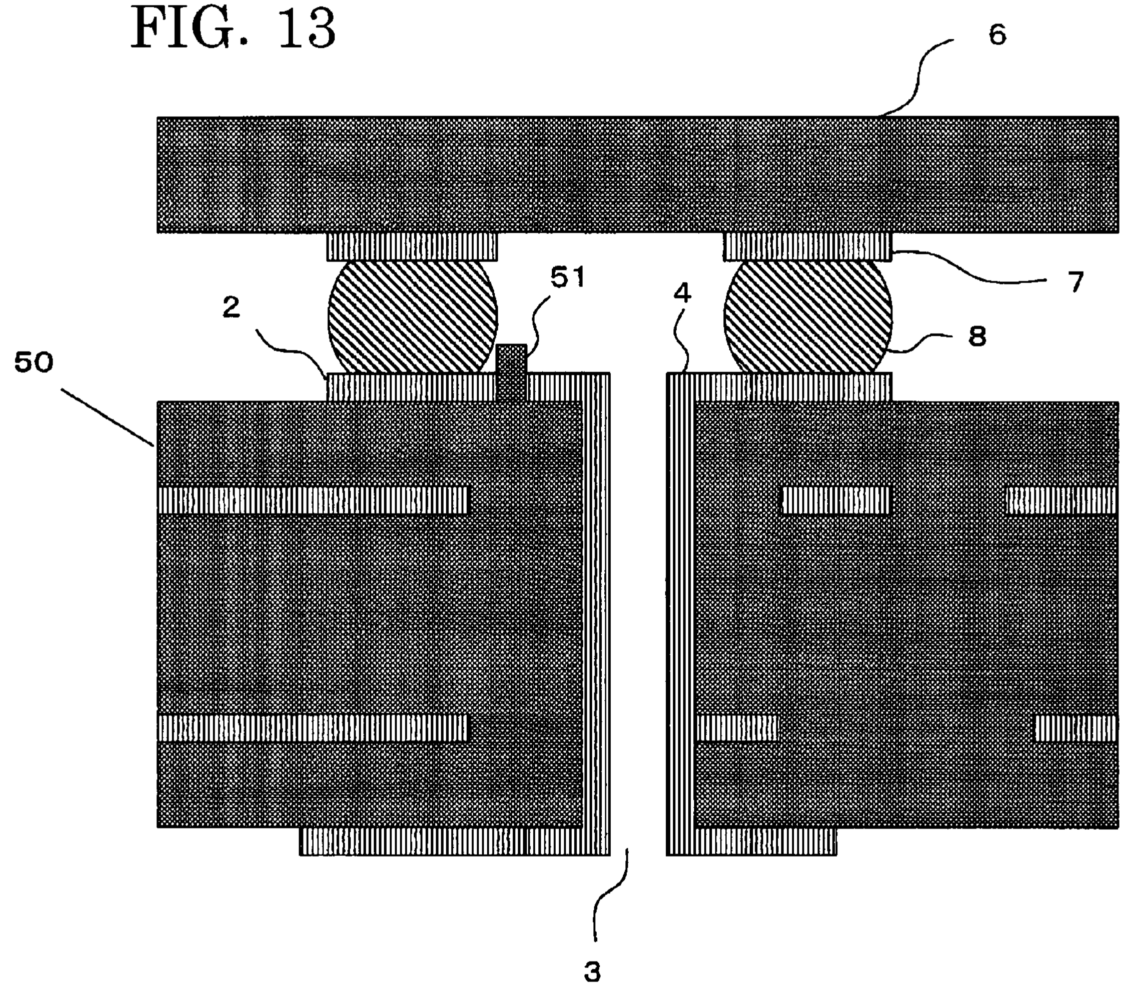
FIG. 13 is a diagram showing other form of printed circuit board in preferred embodiment 4 of the invention.

FIG. 13 is a sectional view of printed circuit board 50 in preferred embodiment 4 of the invention.

In FIG. 13, a rib 51 is provided on printed circuit board 50, and resist layer 30 is applied between the through-hole upper land 4 and soldering land 2 of different potential in a thick layer.

By thus forming the rib 51 having an insulating property between the through-hole upper land 4 and soldering land 2, even if through-hole 3 of conventional size is used, short-circuiting between soldering land 2 of different potential and through-hole upper land 4 can be prevented.

The rib 51 can be formed by applying plural layers of resist layer 30.

In preferred embodiment 4, the rib 51 is formed by the resist layer 30, but any material may be used as far as insulation can be assured between the through-hole upper land 4 and soldering land 2. For example, silk may be used.

Preferred Embodiment 5

Figure 14:
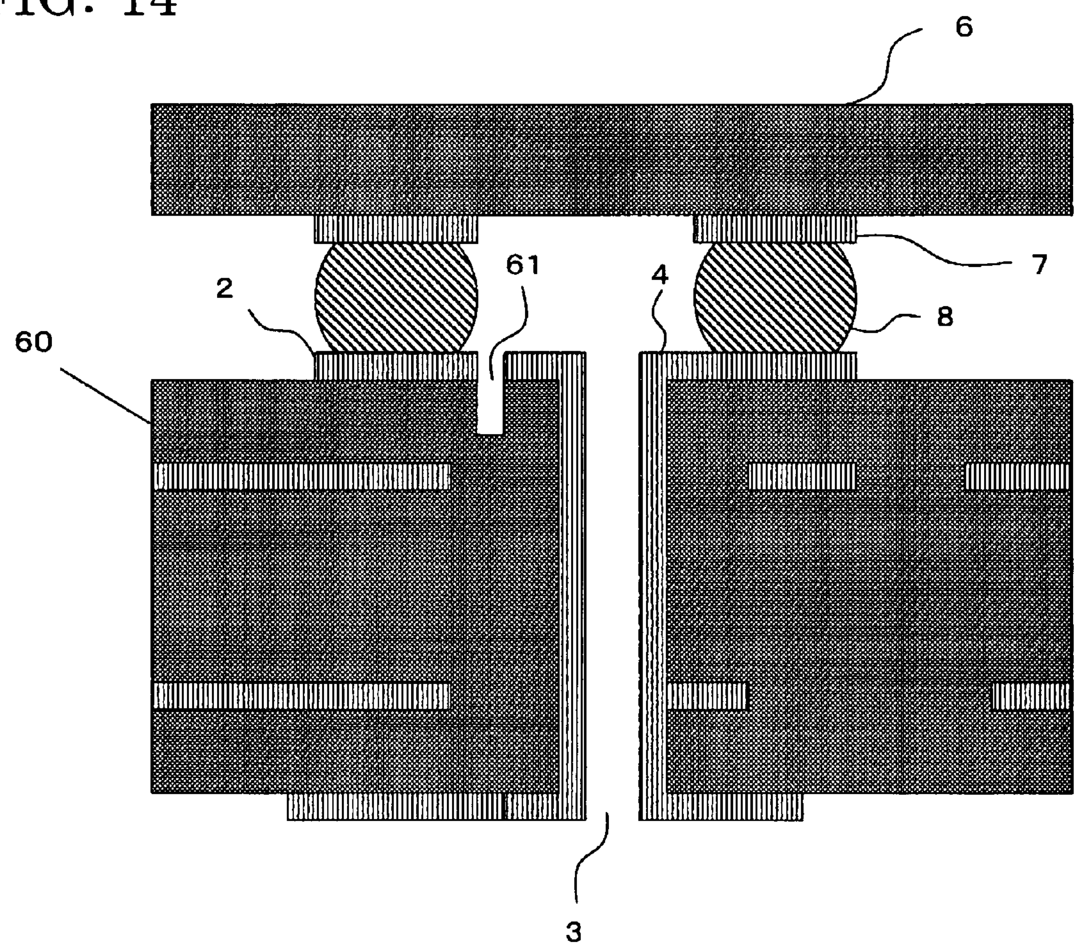
FIG. 14 is a diagram showing other form of printed circuit board in preferred embodiment 5 of the invention.
Figure 15:
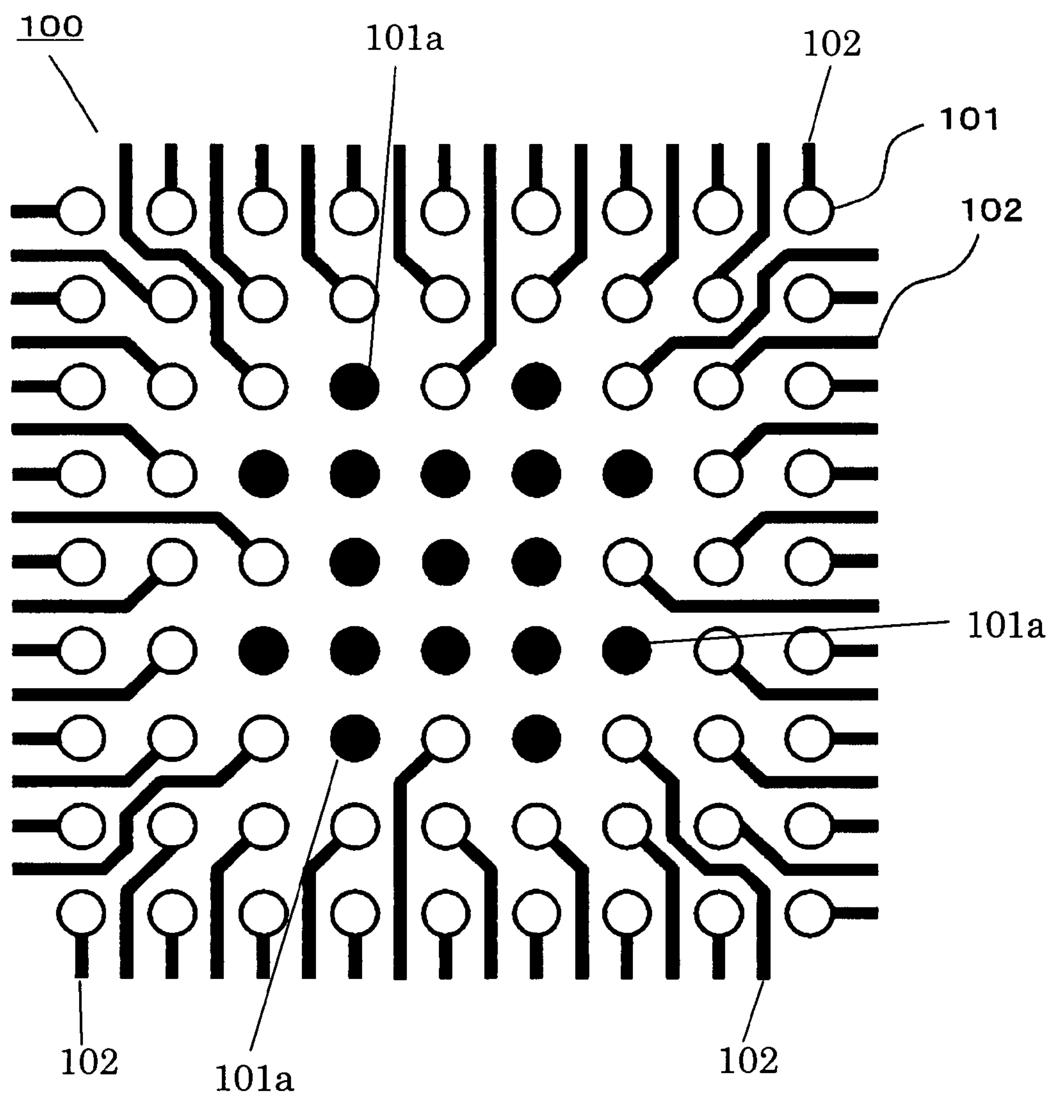
FIG. 15 is a diagram showing an example of printed circuit board in prior art.
Figure 16:
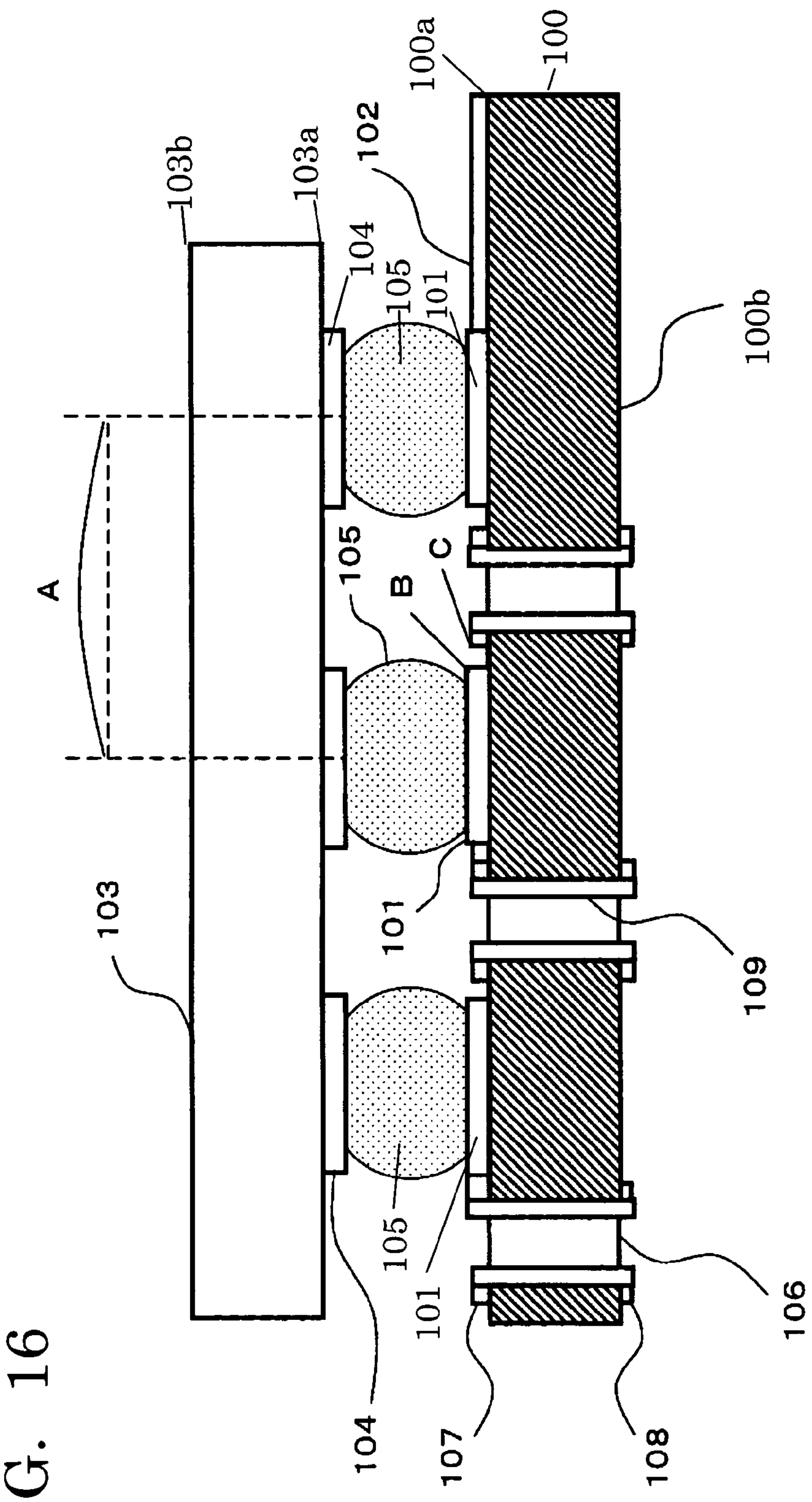
FIG. 16 is a sectional view of printed circuit board in prior art.

FIG. 14 is a sectional view of printed circuit board 60 in preferred embodiment 5 of the invention.

In FIG. 14, a groove 61 is provided around the through-hole upper land 4. By forming the groove 61 around the through-hole upper land 4, a creeping distance is kept between the through-hole upper land 4 and soldering land 2 of different potential, and short-circuiting of the two can be prevented. If solder of soldering land 2 of different potential flows, since it is sucked by the groove 61, it does not flow into the through-hole upper land 4.

INDUSTRIAL APPLICABILITY

In the printed circuit board and designing method of printed circuit board of the invention, since IC package of narrow pitch such as BGA can be mounted on an inexpensive printed circuit board having through-holes of conventional size, the industrial applicability is outstanding.

The invention claimed is:

1. A printed circuit board mounting IC package having plural connection terminals arrayed in lattice, comprising:

plural soldering lands arranged in lattice on a principal surface of the printed circuit board, each of which is provided for connecting corresponding one of the plural connection terminals of the IC package and includes a circular portion, circular portions of the plurality of soldering lands having the same area;

through-holes penetrating through the printed circuit board from the principal surface to a wiring surface opposite to the principal surface; and through-hole upper lands having a circular shape with larger in diameter than said circular portion of said soldering lands, each one of said through-hole upper lands being concentrically provided around the circumference of corresponding one of the through-holes, said through-hole upper lands being disposed on the principal surface of said printed circuit board, wherein:

at least one of the through-holes is surrounded by plural soldering lands in a plan view on the principal surface, and is arranged eccentric from a center of the plural soldering lands surrounding said at least one of the through-holes toward one of the soldering lands surrounding said at least one of the through-holes in a plan view, said one of the soldering lands having a same potential as said at least one of the through-holes and connected to a through-hole upper land of said at least one of the through-holes, a diameter of the through-hole upper land of said at least one of the though-holes overlaps with a diameter of the circular portion of said one of the soldering lands having a same potential, but does not overlap with diameters of the circular portions of said plural soldering lands which are different from said one of the soldering lands having a same potential, in a plan view, so that the circular through-hole upper land of said at least one of the though-holes is physically in contact with the circular portion of said one of the soldering lands having a same potential on the principal surface.

2. The printed circuit board of claim 1, wherein the through-hole is eccentric to the central direction side of two soldering lands if two soldering lands of same potential are present among the plural soldering lands surrounding the through-hole.

3. The printed circuit board of claim 1, wherein the through-hole is eccentric to the central soldering landside if three soldering lands of same potential are present among the plural soldering lands surrounding the through-hole.

4. The printed circuit board of claim 1, wherein supposing the distance from the central point of soldering lands of different potential to the central point of through-hole to be α, the radius of soldering land to be rS, the radius of through-hole upper land to be rTL, and the minimum distance required between the soldering land of different potential and the through-hole upper land to be Y, the through-hole is surrounded by the soldering lands, and the position of central point of the through-hole satisfies the condition of ($\alpha>rS+Y+rTL$).

5. The printed circuit board of claim 1, further comprising:

a resist layer covering the printed circuit board, a through-hole upper land opening exposing the through-hole upper land from the resist layer, and a land opening exposing the land from the resist layer, wherein the through-hole upper land opening side of the land opening is covered with the resist layer.

6. The printed circuit board of claim 1, wherein the printed circuit board is formed in a concave shape in through-hole upper parts surrounded by plural soldering lands, and the through-hole upper lands are formed in this concave bottom.

7. The printed circuit board of claim 1, wherein ribs of insulating material are provided on the printed circuit board between through-hole upper parts surrounded by plural soldering lands, and soldering lands of different potential not connected to the through-hole upper lands.

8. The printed circuit board of claim 1, wherein grooves are provided on the printed circuit board between through-hole upper parts surrounded by plural soldering lands, and soldering lands of different potential not connected to the through-hole upper lands.

9. The printed circuit board of claim 1, wherein the IC package is any one of BGA (ball grid array), CSP (chip scale package), and LGA (land grip array).

10. A designing method of printed circuit board having through-holes as set forth in claim 1.

11. A connecting method of IC package on a printed circuit board for soldering and connecting a printed circuit board as set forth in claim 1, and the IC package, characterized by printing solder at position of soldering lands of same potential by deviating in a direction departing from the through-holes.

12. A connection terminal designing method of IC package in a sequence of connection terminals of the IC package connected to a printed circuit board as set forth in claim 1, characterized by disposing plural connection terminals of same potential at close distance.

13. The printed circuit board of claim 1, wherein four soldering lands surround said at least one of the through-holes.

14. The printed circuit board of claim 1, wherein:

said at least one of the through-holes is arranged so as to satisfy the following relationship:

$$D<rS+rTL,$$

where:

D is a distance between centers of said at least one of the through-holes and said one of the soldering lands having the same potential, rS is the radius of said one of the soldering lands having the same potential, and rTL is the radius of said at least one of the through-holes.

15. The printed circuit board of claim 4, wherein supposing the distance from the central point of soldering land of same potential to the central point of through-hole to be β, and the radius of through-hole to be rT, the position of central point of the through-hole satisfies the condition of ($\beta>rS+rT$).

16. The printed circuit board of claim 5, wherein the through-hole upper land opening side of the land opening is covered with the resist layer in an arc form to be concentric with the through-hole upper land.

17. The printed circuit board of claim 5, wherein the land having the land opening covering the through-hole upper land opening side with the resist layer is a land connecting with any one of power source terminal, ground terminal, and NC terminal.

18. The printed circuit board of claim 5, wherein the land having the land opening covering the through-hole upper land opening side with the resist layer has an extending portion extending the land in any direction other than the through-hole upper land opening side.

19. The printed circuit board of claim 7, wherein the ribs are formed by a thick coat of silk.

20. The printed circuit board of claim 7, further comprising:

a resist layer for covering the printed circuit board, wherein the ribs are formed by a thick coat of this resist layer.

* * * * *